United States Patent [19]

Nakano

[11] Patent Number: 5,670,801
[45] Date of Patent: Sep. 23, 1997

[54] HETEROJUNCTION BIPOLAR TRANSISTOR

[75] Inventor: Hirofumi Nakano, Tokyo, Japan

[73] Assignee: Mitsubishi Denki Kabushiki Kaisha, Tokyo, Japan

[21] Appl. No.: 582,317

[22] Filed: Jan. 3, 1996

[30] Foreign Application Priority Data

Mar. 1, 1995 [JP] Japan ................................. 7-041763

[51] Int. Cl.⁶ .............................................. H01L 29/201
[52] U.S. Cl. ............................................ 257/198; 257/593
[58] Field of Search .............................. 257/197, 198, 257/593, 276

[56] References Cited

U.S. PATENT DOCUMENTS

| | | | |
|---|---|---|---|
| 4,611,388 | 9/1986 | Pande | 257/197 |
| 5,268,315 | 12/1993 | Prasad et al. | 437/31 |
| 5,411,632 | 5/1995 | Delage et al. | 156/652.1 |
| 5,436,497 | 7/1995 | Miyauchi et al. | 257/587 |

FOREIGN PATENT DOCUMENTS 5-198586  8/1993  Japan ................................. 257/197

*Primary Examiner*—Jerome Jackson
*Assistant Examiner*—John F. Guay
*Attorney, Agent, or Firm*—Leydig, Voit & Mayer, Ltd.

[57] ABSTRACT

A method of fabricating a semiconductor device includes producing a collector layer, a base layer, and an emitter layer on a semiconductor substrate; producing a dummy emitter electrode on a region of the emitter layer; forming a first resist except where the dummy emitter electrode is present; completely removing the dummy emitter electrode to expose the surface of the emitter layer; depositing an emitter electrode material on the first resist and the emitter layer that is exposed by the removal of the dummy emitter electrode; forming a mask on a region of the emitter electrode material film where an emitter electrode is later produced; and etching the emitter electrode material film using the mask; and removing the first resist, thereby producing an emitter electrode layer, a peripheral side part extending upward from the bottom part, and an upper fringe part protruding outward from the peripheral side part perpendicular to the peripheral side part. A minute emitter electrode is produced without employing vacuum evaporation and lift-off techniques that can cause burrs on the emitter electrode. Since a refractory metal can be employed as the emitter electrode material, a highly-reliable emitter electrode is produced with high stability.

8 Claims, 13 Drawing Sheets

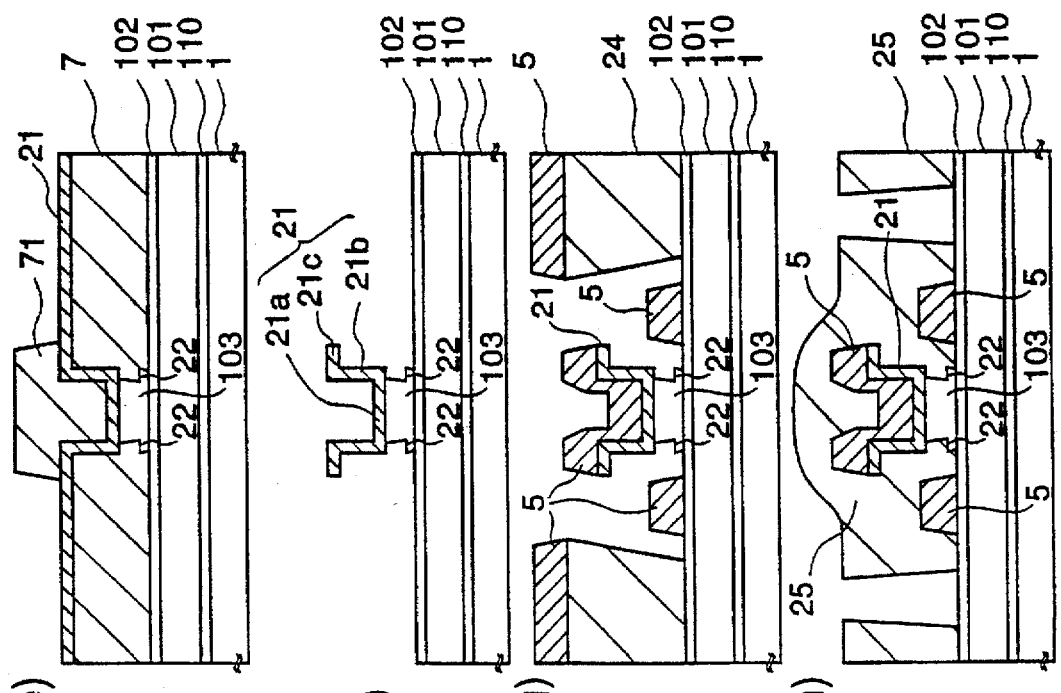
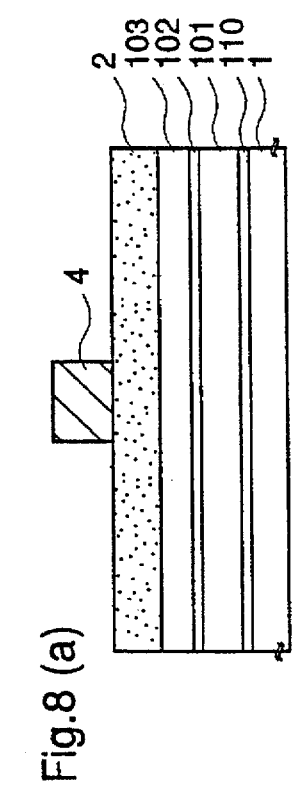
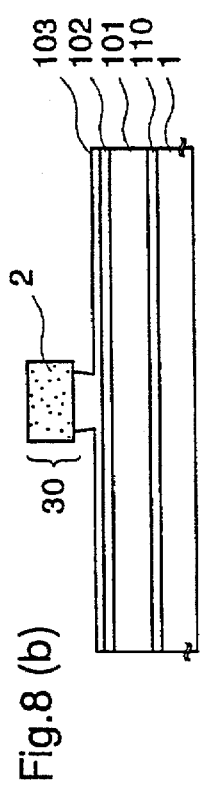
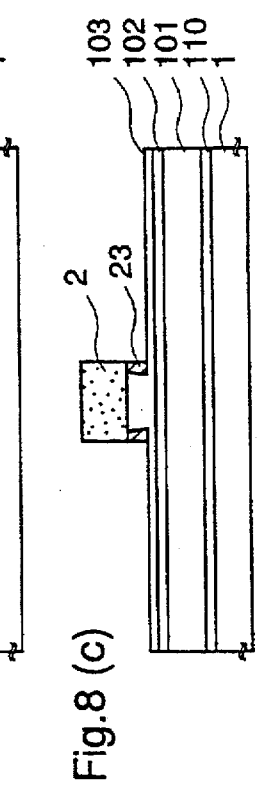
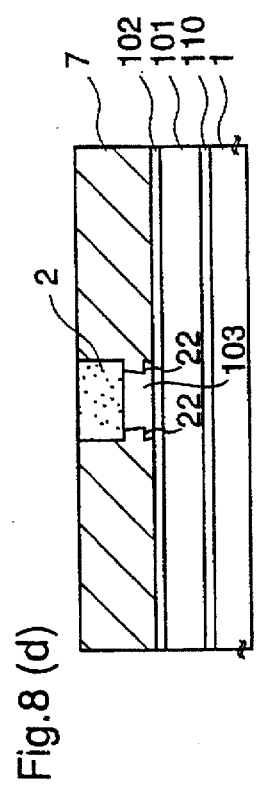

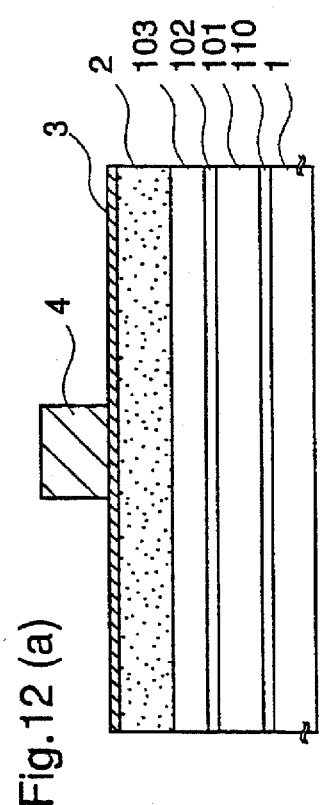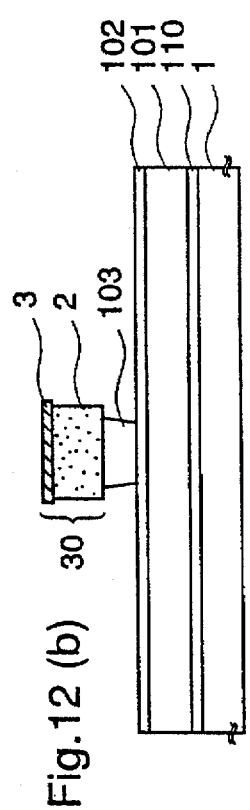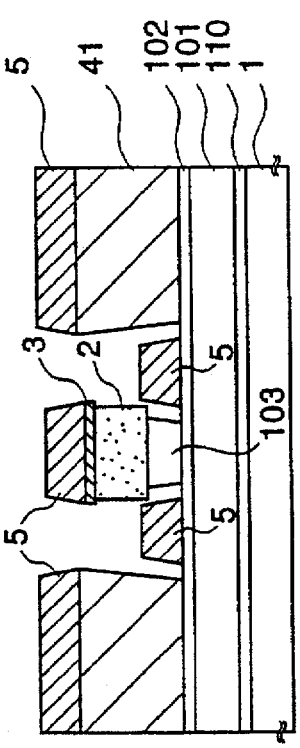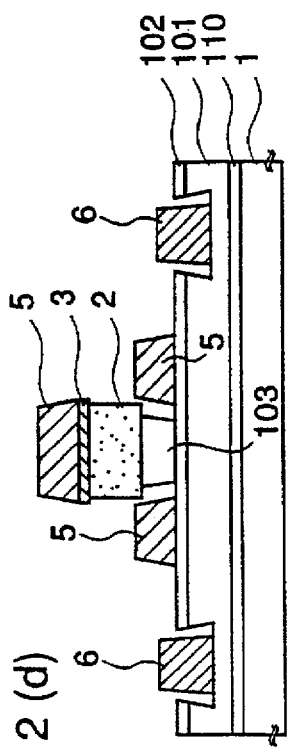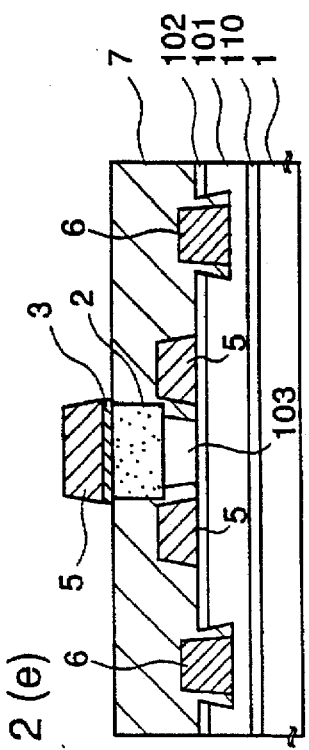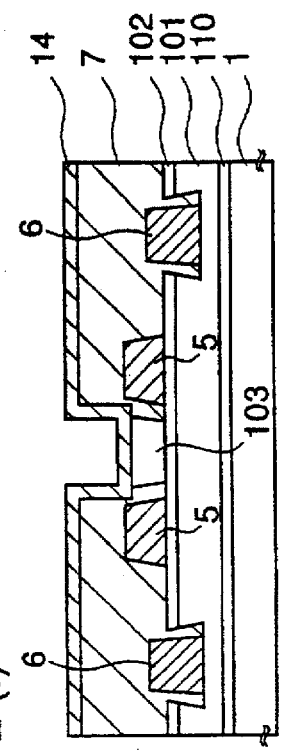

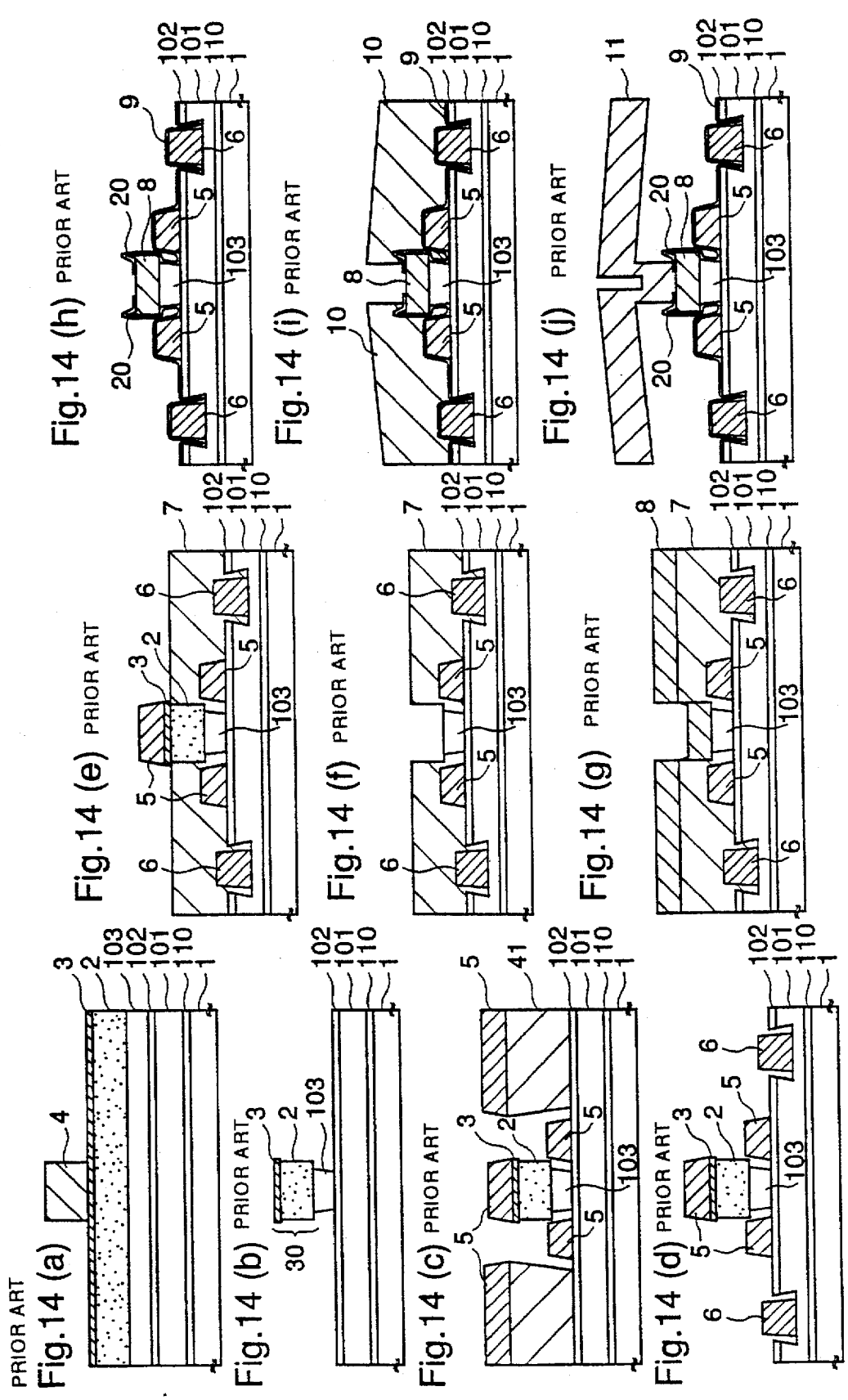

HETEROJUNCTION BIPOLAR TRANSISTOR

FIELD OF THE INVENTION

The present invention relates to heterojunction bipolar transistors (hereinafter referred to as HBTs) and method for fabricating the HBTs.

BACKGROUND OF THE INVENTION

FIGS. 14(a)–14(j) are cross-sectional views illustrating process steps in a method of fabricating an HBT according to a prior art.

Initially, as illustrated in FIG. 14(a), an intrinsic (hereinafter referred to as i type) GaAs buffer layer 110, an n type GaAs collector layer 101, a p type GaAs base layer 102, and an emitter layer 103 are epitaxially grown on an undoped GaAs substrate 1 in this order. The emitter layer 103 comprises n type AlGaAs at the side of the base layer and n type GaAs at the side of an emitter electrode which is later produced on the emitter layer. Then, an insulating film 2 for a dummy emitter electrode (hereinafter referred to as dummy emitter insulating film 2) and a cap film 3 are deposited on the emitter layer 103. Preferably, the dummy emitter insulating film 2 comprises SiON, the cap film 3 comprises WSi, and the deposition method is CVD (chemical vapor deposition) or sputtering. Thereafter, a resist 4 is formed on a region where a dummy emitter electrode will be formed.

In the step of FIG. 14(b), using the resist 4 as a mask, the WSi cap film 3 is etched by RIE (reactive ion etching) or the like. Further, using the WSi cap film 3 as a mask, the dummy emitter insulating film 2 is etched. In this etching process, the sides of the insulating film 2 are etched so that the width of the insulating film 2 becomes narrower than the width of the WSi cap film 3. As a result of the etching, a dummy emitter electrode 30 comprising the WSi cap film 3 and the dummy emitter insulating film 2 is produced. Thereafter, using the dummy emitter electrode 30 as a mask, the emitter layer 103 is etched until the surface of the base layer 102 is exposed. In this etching process, the sides of the emitter layer 103 are etched so that the width of the emitter layer 103 becomes narrower than the width of the insulating film 2 included in the dummy emitter electrode 30.

In the step of FIG. 14(c), a resist pattern 41 is formed on the base layer 102. The resist pattern 41 has an opening opposite a region of the base layer 102 including a region where the emitter layer 103 is left under the dummy emitter electrode 30 and regions adjacent to the emitter layer 103 where base electrodes are later produced. Then, a laminated metal layer 5 for base electrodes (hereinafter referred to as base metal), such as Ti/Mo/Au or Pt/Ti/Pt/Au, is deposited over the entire surface by vacuum evaporation, and the resist 41 and unnecessary portions of the base metal 5 on the resist 41 are removed by the lift-off technique. Since the width of the dummy emitter insulating film 2 is narrower than the width of the WSi cap film 3 and the width of the emitter layer 103 is narrower than the width of the dummy emitter insulating film 2, the base metal 5 is not deposited on the side surfaces of the dummy emitter insulating film 2 and the emitter layer 103. Therefore, base electrodes comprising the base metal 5 are produced on regions of the base layer 102 at the both sides of and adjacent to the emitter layer 103, self-alignedly with the dummy emitter electrode 30. Next, a resist (not shown) having openings on prescribed regions outside the base electrodes 5 is formed, and the base layer 102 and the collector layer 101 are etched through the openings of the resist to a depth reaching into the collector layer 101. As a result of the etching, the collector layer 101 is exposed in the openings of the resist. Thereafter, a laminated metal layer for collector electrodes, such as AuGe/Ni/Au, is deposited by vacuum evaporation, and the resist and unnecessary portions of the metal layer on the resist are removed by the lift-off technique, producing collector electrodes 6 as shown in FIG. 14(d).

Thereafter, a resist 7 is applied over the entire surface to a thickness sufficient to cover the base metal 5 on the dummy emitter electrode 30, followed by etching of the resist 7. The etching is stopped when the base metal 5 is completely exposed as shown in FIG. 14(e). In place of the etching process, the following process may be employed for the patterning of the resist 7. That is, after the entire surface is coated with the resist 7, an opening is formed in the resist 7 opposite a region including the dummy emitter electrode 30 and a little wider than the electrode 30 using photolithographic techniques and, thereafter, the resist 7 is deformed by heating so that the side surfaces of the resist 7 in the opening are closely adhered to both sides of the dummy emitter electrode 30.

In the step of FIG. 14(f), the base metal 5 on the surface of the resist 7 is removed by ion milling, the WSi cap layer 3 is removed by RIE, and the dummy emitter insulating film 2 is removed by wet etching to expose the surface of the emitter layer 103. As a result of the etching, the resist 7 has an opening produced by the removal of the dummy emitter electrode.

In the step of FIG. 14(g), a laminated metal layer 8 for an emitter electrode (hereinafter referred to as emitter metal), such as Ti/Mo/Au or AuGe/Ni/Au, is deposited over the entire surface by vacuum evaporation. Thereafter, the resist 7 and unnecessary portions of the emitter metal 8 on the resist 7 are removed by the lift-off technique, producing an emitter electrode 8 on the emitter layer 103.

In the step of FIG. 14(h), a protection film 9 comprising SiON is deposited over the entire surface, and a portion of the protection film 9 on the surface of the emitter electrode 8 is removed using conventional photolithography and etching techniques to produce an opening that is called a contact hole. In the vacuum deposition of the emitter metal 8, since the emitter metal 8 is attached to the side surfaces of the resist 7 in the opening produced by the removal of the dummy emitter electrode, projections 20, which are called burrs, are produced at the periphery of the emitter electrode 8 left on the emitter layer 103 after the lift-off of the emitter metal.

In the step of FIG. 14(i), a resist 10 is applied over the entire surface, and an opening is formed in the resist 10 opposite a region including the contact hole on the emitter electrode by photolithography. Thereafter, a feeding layer for electroplating, such as Ti/Au, is deposited over the entire surface. The feeding layer is covered with a mask except a region where an air-bridge wiring is later produced and a region in the opening of the resist 10, followed by electroplating of an Au layer on the unmasked region of the feeding layer. After the electroplating, the mask, unnecessary parts of the feeding layer on which the Au layer is not plated, and the resist 10 are removed, producing an air-bridge wiring 11 comprising the feeding layer and the plated Au layer and having a part connected to the emitter electrode 8, whereby the HBT shown in FIG. 14(j) is completed.

In the HBT, the current flowing between the collector and the emitter is controlled by the current flowing between the base and the emitter. In addition, since the wiring connected to the emitter electrode is an air-bridge wiring, the parasitic capacitance of the wiring is reduced compared with a case where the wiring is disposed on the semiconductor layer, whereby operation of the device in a higher frequency band is realized.

In the above-described prior art method of fabricating an HBT, the emitter electrode is produced by vacuum evaporation and lift-off. Since the side surface of the resist 7 in the opening wherein the emitter electrode 8 is formed is almost vertical, when the emitter metal is deposited, the emitter metal is attached to the side surface, resulting in the burrs 20 of the emitter electrode 8 in the subsequent lift-off step. In order to avoid the generation of the burrs, the cross-sectional shape of the opening of the resist 7 must be wider at the lower part than at the upper part. For this purpose, the cross-sectional shape of the dummy emitter electrode 30 must be wider at the lower part than at the upper part. However, since the base electrodes 5 are produced by vacuum evaporation with the dummy emitter electrode as a mask, in order to avoid unwanted contact of the emitter electrode 8, which takes the place of the dummy emitter electrode later, with the base electrodes 5, the lower part of the dummy emitter electrode is narrower than the upper part thereof. This shape of the dummy emitter electrode is realized by etching the dummy emitter insulating film 2 constituting the lower part of the dummy emitter electrode using the WSi layer 3 constituting the upper part of the dummy emitter electrode as a mask. Consequently, in the prior art method, it is difficult to avoid the generation of the burrs 20.

As described above, in the prior art method of fabricating an HBT, the emitter metal 8 attached to the side surface of the resist 7 in the opening makes the lift-off of the emitter metal difficult and, therefore, it is very difficult to produce the emitter electrode 8 with high stability. In addition, the burrs 20 of the emitter electrode 8 produced in the lift-off step degrade the reliability of the HBT.

The reliability of the emitter electrode is higher when the emitter electrode comprises a refractory metal, such as WSi, than when it comprises a metal such as Ti/Mo/Au or AuGe/Ni/Au. Usually, sputtering is employed as a method for depositing a refractory metal. However, if the emitter electrode 8 is produced by sputtering of a refractory metal, since the refractory metal is deposited on the side surface of the resist 7 in the opening, it is very difficult to lift off the metal. Therefore, it is difficult to produce an emitter electrode comprising a refractory metal in the above-described prior art method.

In order to operate the HBT in a higher frequency band, the emitter structure must be reduced in size. With the reduction in the emitter size, the width of the contact hole must be reduced. However, since conventional photolithography is employed for patterning of the contact hole on the emitter electrode, it is difficult to reduce the width of the contact hole below the resolution limit of photolithography. Further, photolithography has an alignment limit, and it is necessary to include a margin for a positional error within the limit. The opening of the resist 10 that is an underlying layer when the air-bridge wiring 11 contacting the emitter electrode 8 through the contact hole is produced, is also formed by photolithography. Therefore, at least a distance that can secure a margin considering the positional error of photolithography in forming the contact hole and in for forming the opening of the resist 10 is necessary between the edge of the contact hole and the edge of the emitter electrode. Accordingly, the limit of the reduction in sizes of the emitter electrode and the emitter layer depends on the resolution limit and the alignment precision of the photolithography, and a reduction exceeding this limit is not possible in the prior art method.

SUMMARY OF THE INVENTION

It is an object of the present invention to provide a semiconductor device including a highly-reliable minute emitter electrode which can be connected to an air-bridge wiring and providing improved operating characteristics in a high frequency band.

It is another object of the present invention to provide a method for fabricating the semiconductor device in a stable and simple process.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of fabricating a semiconductor device includes producing a laminated semiconductor structure comprising a collector layer, a base layer, and an emitter layer on a semiconductor substrate with the collector layer in contact with the semiconductor substrate; producing a dummy emitter electrode on a prescribed region within a region of the emitter layer at the surface of the laminated semiconductor structure where an emitter electrode is later produced; forming a first resist on the surface of the laminated semiconductor structure except a region where the dummy emitter electrode is present so that the upper surface of the dummy emitter electrode is exposed at the surface of the first resist; completely removing the dummy emitter electrode having the upper surface at the surface of the first resist, thereby exposing the surface of the emitter layer; depositing a film comprising a material for an emitter electrode over the entire surface including the surface of the first resist and the surface of the emitter layer that is exposed by the removal of the dummy emitter electrode; and forming a mask on a region of the emitter electrode material film where an emitter electrode is later produced, and etching the emitter electrode material film using the mask, followed by removal of the first resist, thereby producing an emitter electrode comprising a planar bottom part that contacts the emitter layer at the lower surface, a peripheral side part extending upward from the peripheral portion of the bottom part, and an upper fringe part protruding outward from the upper end of the peripheral side part in the direction perpendicular to the peripheral side part. Therefore, a minute emitter electrode is produced without employing vacuum evaporation and lift-off techniques that cause burrs on the periphery of the emitter electrode. Since sputtering of a refractory metal can be employed for the deposition of the emitter electrode material, a highly-reliable emitter electrode is produced with high stability. Further, the planar bottom part and the peripheral side part of the emitter electrode are produced in the space produced by the removal of the dummy emitter electrode whereas the upper fringe part of the emitter electrode is produced in the mask region for etching the emitter electrode material that is wider than the dummy emitter electrode. Therefore, when a reduction in the size of the emitter layer is desired, it is realized by reducing the size of the dummy emitter electrode, i.e., the size of the planar bottom part of the emitter electrode, while a sufficient width for connecting a wiring is secured for the upper fringe part of the emitter electrode. Thereby, further reduction in the sizes of the emitter layer and the emitter electrode is realized, resulting in a semiconductor device operating in a higher frequency band.

According to a second aspect of the present invention, the above-described method includes producing the dummy emitter electrode so that the width of the upper part becomes wider than the width of the lower part; after the formation of the dummy emitter electrode and before the formation of the first resist, forming a mask on a region other than the region where the dummy emitter electrode is present and prescribed regions adjacent to the dummy emitter electrode, followed by deposition of a base electrode material over the entire surface, thereby producing base electrodes on the base layer exposed at the regions adjacent to the dummy emitter electrode; forming the first resist on a region other than the region where the dummy emitter electrode is present so that the base electrode material deposited on the dummy emitter electrode protrudes from the surface of the first resist; and after removal of the base electrode material deposited on the dummy emitter electrode, removing the dummy emitter electrode. In this method, since the base electrodes are produced self-alignedly with the dummy emitter electrode, i.e., the planar bottom part of the emitter electrode, there is no error in the relative positions of the base electrodes and the emitter electrode. As a result, the uniformity of electrical characteristics of the semiconductor device is improved.

According to a third aspect of the present invention, the above-described method includes, after the formation of the emitter electrode, forming a mask on a region other than the region where the emitter electrode is present and prescribed regions adjacent to the emitter electrode, followed by deposition of a base electrode material over the entire surface, thereby producing base electrodes on the base layer exposed at the regions adjacent to the emitter electrode. In this method, since the base electrodes are produced self-alignedly with the upper fringe part of the emitter electrode, the distance between the planar bottom part of the emitter electrode and the base electrodes can be changed by changing the width of the upper fringe part of the emitter electrode, whereby the degree of freedom in design of the semiconductor device is increased.

According to a fourth aspect of the present invention, the above-described method includes, after the formation of the emitter electrode and the formation of the base electrodes, producing an air-bridge wiring on a region including the emitter electrode by electroplating, contacting a portion of the upper surface of the emitter electrode. As described above, since the width of upper fringe part of the emitter electrode is wider than the reduced emitter layer and the reduced bottom part of the emitter electrode, the air-bridge wiring can be connected to the emitter electrode with high stability in a relatively simple process. Further, since the air-bridge wiring is employed, the capacitance of the wiring is reduced, resulting in a high-frequency operation of the semiconductor device. In addition, heat generated in the semiconductor device is dissipated through the emitter electrode and the air-bridge wiring with high efficiency.

According to a fifth aspect of the present invention, the above-described method includes depositing a feeding layer for electroplating over the entire surface including the surface of the first resist and the surface of the emitter layer exposed by the removal of the dummy emitter electrode; and forming a mask on the feeding layer except a region where an emitter electrode is later produced, including the region where the dummy emitter electrode was disposed, and a region where an air-bridge wiring to be connected to the emitter electrode is later produced, followed by electroplating of a metal to the unmasked region of the feeding layer, thereby producing an emitter electrode and an air-bridge wiring which comprise a continuous plated metal layer and are united in one body. In this method, since the emitter electrode and the air-bridge wiring are simultaneously fabricated as a continuous metal layer, the fabricating process of the air-bridge wiring is reliable and simplified. As a result, the reliability of the connection between the emitter electrode and the air-bridge wiring is improved compared with the above-described method.

According to a sixth aspect of the present invention, in the above-described method, the emitter electrode material is a refractory metal. Therefore, unwanted reaction between the emitter electrode and the emitter layer during the operation of the device is suppressed, whereby the reliability of the semiconductor device is further improved.

According to a seventh aspect of the present invention, in the above-described method, the feeding layer for electroplating comprises a refractory metal. Since the refractory metal feeding layer at the lower surface of the emitter electrode directly contacts the emitter layer, unwanted reaction between the emitter electrode and the emitter layer during the operation of the device is suppressed, whereby the reliability of the semiconductor device is further improved.

According to an eighth aspect of the present invention, the above-described method includes producing the laminated semiconductor structure by depositing the collector layer, the base layer, and the emitter layer, in this order, over the entire surface of the semiconductor substrate; and after producing the dummy emitter electrode on the emitter layer, using the dummy emitter electrode as a mask, etching the emitter layer disposed on the entire surface of the base layer so that a portion of the emitter layer is left on the base layer in a region where the dummy emitter electrode is present and the base layer is exposed in a region where the dummy emitter electrode is not present, thereby producing an emitter layer protruding upward on the base layer. In this method, since the emitter layer is produced self-alignedly with the dummy emitter, i.e., the planar bottom part of the emitter electrode, there is no error in the relative positions of the emitter layer and the planar bottom part of the emitter electrode, whereby the fabricating process is made stable and the uniformity of electrical characteristics of the semiconductor device is improved.

According to a ninth aspect of the present invention, the above-described method includes, using the dummy emitter electrode as a mask, etching the emitter layer disposed over the entire surface of the base layer so that the emitter layer in the region where the dummy emitter electrode is not present is etched to a prescribed depth within the emitter layer and the emitter layer under the dummy emitter electrode is etched at the side surfaces by a prescribed thickness to retreat the side surfaces of the emitter layer from the side surfaces of the dummy emitter electrode; depositing a second resist over the entire surface to bury the remaining portion of the emitter layer and, thereafter, anisotropically etching the second resist using the dummy emitter electrode as a mask, leaving portion of the second resist only on the side surfaces of the emitter layer under the dummy emitter electrode; and using the dummy emitter electrode and the second resist remaining on the side surfaces of the emitter layer under the dummy emitter electrode as masks, etching the emitter layer remaining on the base layer in the region where the dummy emitter electrode is not present, followed by removal of the second resist, thereby producing an emitter layer protruding upward on the base layer, comprising an upper part formed by the first etching and a lower part formed by the second etching, and having a different in level at the boundary between the upper part and the lower part on the peripheral side surface of the emitter layer. In this method, since the difference in level is produced at the boundary between the upper part and the lower part of the emitter electrode on the peripheral side surface of the emitter electrode, surface leakage current that flows across the emitter electrode 21 and the base electrode 5 through the side surface of the emitter layer is suppressed. This effect is confirmed on experiment and it is thought that a surface depletion layer produced in the protruding part of the emitter layer suppresses the surface leakage current. Since the surface leakage current is suppressed, the current amplification factor is increased, whereby the operation of the semiconductor device in a higher frequency band is realized.

According to a tenth aspect of the present invention, a semiconductor device comprises a laminated semiconductor structure comprising a collector layer, a base layer, and an emitter layer, disposed on a semiconductor substrate; an emitter electrode disposed on the emitter layer and comprising a planar bottom part that contacts the emitter layer at the lower surface, a peripheral side part extending upward from the peripheral portion of the bottom part, and an upper fringe part protruding outward from the upper end of the peripheral side part in the direction perpendicular to the peripheral side part, wherein the planar bottom part, the peripheral side part, and the upper fringe part comprise a conductive material and are united in one body; and base electrodes contacting the base layer and collector electrodes contacting the collector layer. Therefore, when the emitter layer is reduced in size, only the width of planar bottom part of the emitter electrode is reduced, and a sufficient width for reliably connecting a wiring is secured for the upper fringe part of the emitter electrode. Therefore, compared with the prior art semiconductor device, further reduction in the sizes of the emitter layer and the emitter electrode is realized, realizing the operation of the semiconductor device in a higher-frequency band.

According to an eleventh aspect of the present invention, in the above-described semiconductor device, the base electrodes are disposed on the base layer exposed in regions at both sides of the emitter electrode and self-aligned with the planar bottom part of the emitter electrode. Therefore, there is no error in the relative positions of the base electrodes and the emitter electrode. As a result, the uniformity of electrical characteristics of the semiconductor device is improved.

According to a twelfth aspect of the present invention, in the above-described semiconductor device the base electrodes are disposed on the base layer exposed in regions at both sides of the emitter electrode and self-aligned with the upper fringe part of the emitter electrode. In this structure, the distance between the bottom part of the emitter electrode and the base electrode can be changed by changing the width of the upper fringe part of the emitter electrode. As a result, the degree of freedom in design of the semiconductor device is increased.

According to a thirteenth aspect of the present invention, in the above-described semiconductor device, the emitter electrode comprises a refractory metal. Therefore, unwanted reaction between the emitter electrode and the emitter layer during the operation of the semiconductor device is suppressed, whereby the reliability of the semiconductor device is further improved.

According to a fourteenth aspect of the present invention, the above-described semiconductor device further includes an air-bridge wiring connected to the emitter electrode at a portion of the emitter electrode inside the opposite outer edges of the upper fringe part and including the planar bottom part. As described above, even when the emitter layer and the bottom part of the emitter electrode are reduced in size, the upper fringe part of the emitter electrode is wider than the emitter layer and the bottom part. Therefore, the air-bridge wiring is reliably connected to the upper fringe part of the emitter electrode. Further, the air-bridge wiring permits the semiconductor device to operate in a high-frequency band and improves the heat dissipation property of the device during the operation.

According to a fifteenth aspect of the present invention, the above-described semiconductor device further includes an air-bridge wiring comprising the same material as the emitter electrode and being united with the emitter electrode in one body. Therefore, the reliability of the connection between the emitter electrode and the air-bridge wiring is improved.

According to a sixteenth aspect of the present invention, in the above-described semiconductor device, the united emitter electrode and air-bridge wiring comprises a lower layer of a refractory metal and an upper layer of a low resistance metal. Since the lower refractory metal layer contacts the emitter layer, unwanted reaction between the emitter electrode and the emitter layer during the operation of the semiconductor device is suppressed, whereby the reliability of the device is further improved.

According to a seventeenth aspect of the present invention, in the above-described semiconductor device, the emitter layer protrudes upward on a prescribed region of the base layer and the planar bottom part of the emitter electrode covers the top surface of the emitter layer. Therefore, when the emitter layer is reduced in size, only the width of planar bottom part of the emitter electrode is reduced, and a sufficient width for reliably connecting a wiring is secured for the upper fringe part of the emitter electrode. Therefore, it is possible to reduce the emitter layer and the emitter electrode in size, realizing the operation of the semiconductor device in a higher frequency band.

According to an eighteenth aspect of the present invention, in the above-described semiconductor device, the emitter layer is self-aligned with the planar bottom part of the emitter electrode. Therefore, there is no error in the relative positions of the emitter layer and the planar bottom part of the emitter electrode, whereby the uniformity of electrical characteristics of the semiconductor device is improved.

According to a nineteenth aspect of the present invention, in the above-described semiconductor device, the emitter layer comprises a lower part disposed on the base layer and an upper part smaller than the lower part and disposed on and within the lower part, and a difference in level is produced at the boundary between the upper part and the lower part on the peripheral side surface of the emitter layer. Therefore, surface leakage current that flows across the emitter electrode 21 and the base electrode 5 through the side surface of the emitter layer is suppressed. This effect is confirmed on experiment and it is thought that a surface depletion layer produced in the protruding part of the emitter layer suppresses the surface leakage current. Since the surface leakage current is suppressed, the current amplification factor is increased, whereby the operation of the semiconductor device in a higher frequency band is realized.

BRIEF DESCRIPTION OF THE DRAWINGS

FIGS. 8(a)–8(h) are cross-sectional views illustrating process steps in a method of fabricating an HBT in accordance with a fourth embodiment of the present invention.

FIGS. 12(a)–12(f) are cross-sectional views illustrating process steps in a method of fabricating an HBT in accordance with a sixth embodiment of the present invention.

FIGS. 14(a)–14(j) are cross-sectional views illustrating process steps in a method of fabricating an HBT in accordance with the prior art.

DETAILED DESCRIPTION OF THE PREFERRED EMBODIMENTS

[Embodiment 1]

Figure 1:
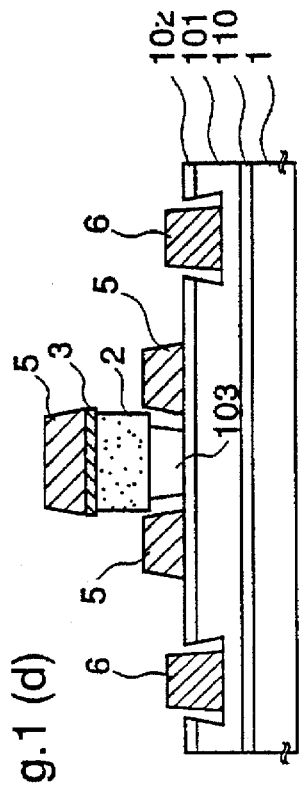
FIGS. 1(a) to 1(f) are cross-sectional views illustrating process steps in a method of fabricating an HBT in accordance with a first embodiment of the present invention.
Figure 1:
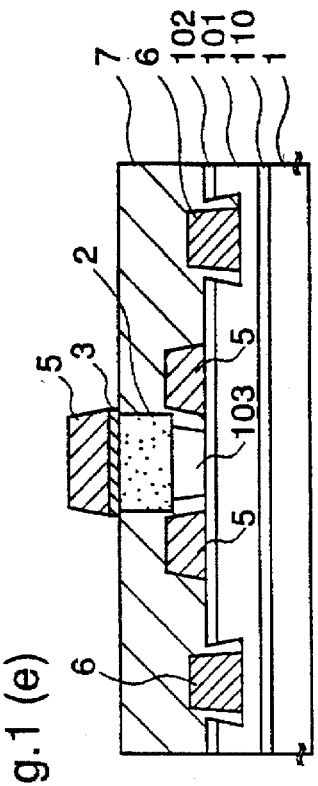
Figure 1:
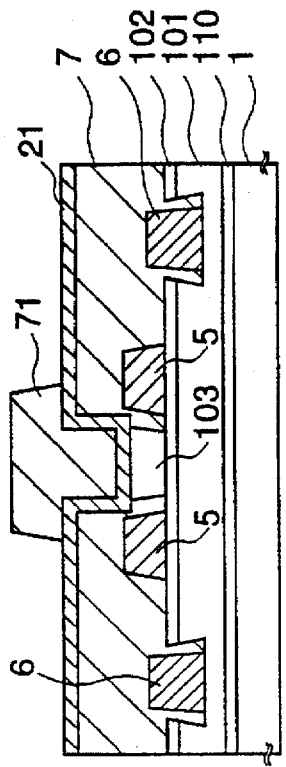
Figure 1:
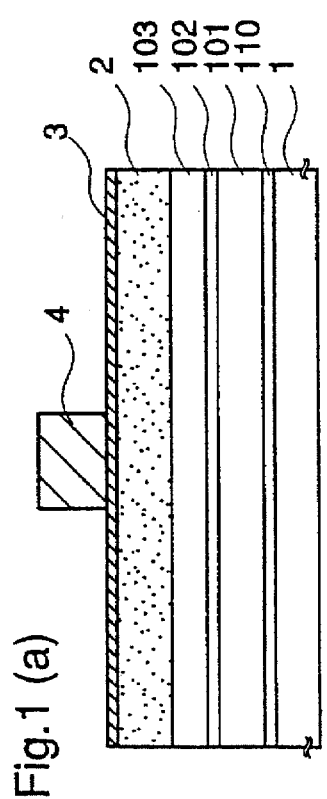
Figure 1:
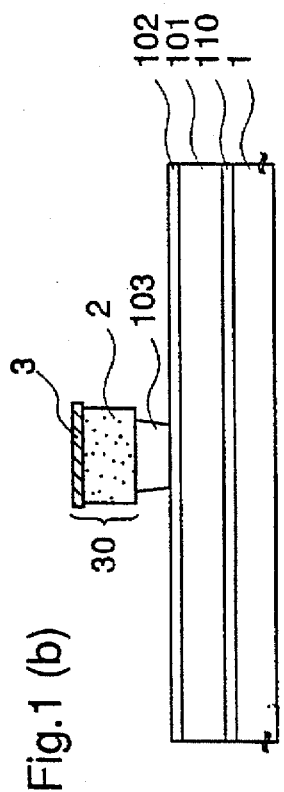
Figure 1:
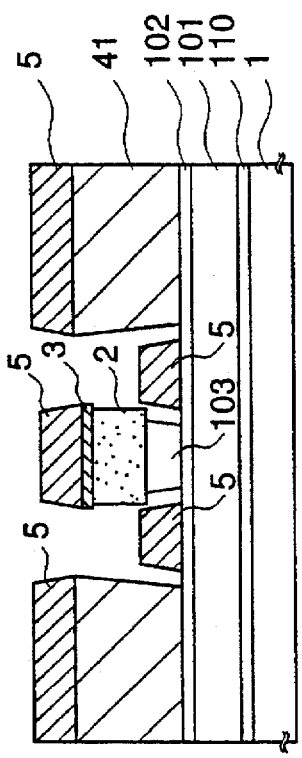

FIGS. 1(a)–1(f) are cross-sectional views illustrating process steps in a method of fabricating an HBT in accordance with a first embodiment of the present invention. In these figures, the same reference numerals as those in FIGS. 14(a)–14(j) designate the same or corresponding parts.

Figure 2:
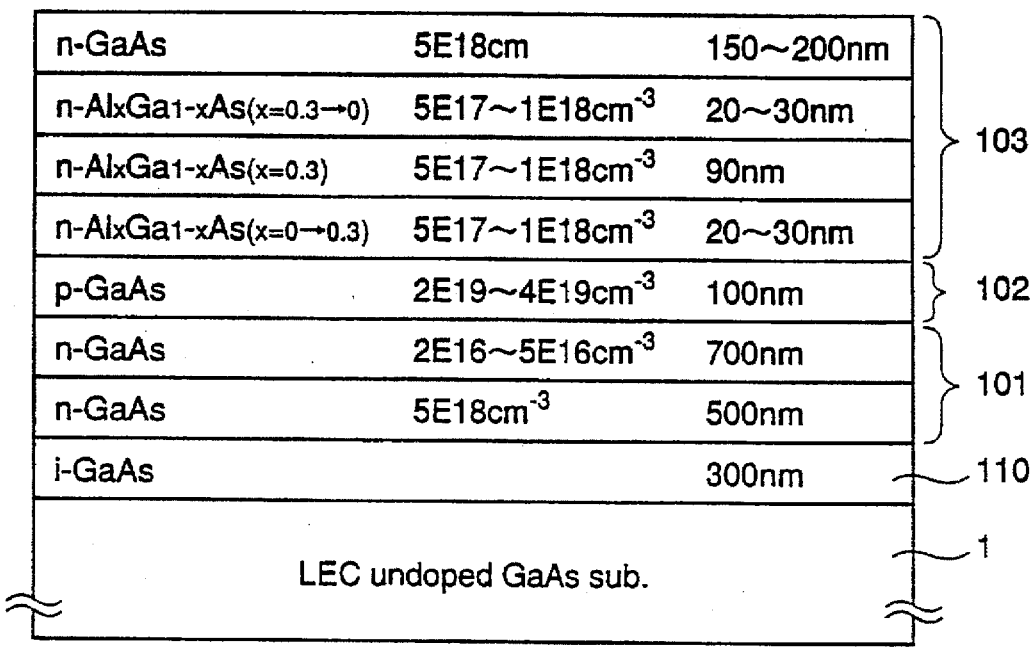
FIG. 2 is a table illustrating a structure of semiconductor layers in an HBT according to the first embodiment of the present invention.

Initially, as illustrated in FIG. 1(a), an i type GaAs buffer layer 110, an n type GaAs collector layer 101, a p type GaAs base layer 102, and an emitter layer 103 are epitaxially grown on an undoped GaAs substrate 1 in this order. The emitter layer 103 comprises n type AlGaAs at the side of the base layer and n type GaAs at the side of an emitter electrode which is later produced on the emitter layer. Then, an insulating film 2 for a dummy emitter electrode (hereinafter referred to as dummy emitter insulating film) and a cap film 3 are deposited on the emitter layer 103. Preferably, the dummy emitter insulating film 2 comprises SiON and has a thickness not exceeding 2 µm, and the cap film 3 comprises WSi and has a thickness not exceeding 500 nm. The deposition method is CVD or sputtering. Thereafter, a resist 4 is formed on a region where a dummy emitter electrode will be formed. FIG. 2 shows the structure of the semiconductor layers epitaxially grown on the GaAs substrate 1. In FIG. 2, the materials, the dopant impurity concentrations, and the thicknesses of the semiconductor layers are shown on the left side, in the center, and on the right side, respectively.

Using the resist 4 as a mask, the WSi cap film 3 is etched by RIE. Further, using the resist 4 and the WSi cap film 3 as masks, the dummy emitter insulating film 2 is etched by RIE. In this etching process, the insulating film 2 are etched so that the width of the insulating film 2 becomes narrower than the width of the WSi cap film 3. As a result of the etching, a dummy emitter electrode 30 comprising the WSi cap film 3 and the dummy emitter insulating film 2 is produced.

In the step of FIG. 1(b), using the dummy emitter electrode 30 as a mask, the emitter layer 103 is etched with an etchant such as tartaric acid until the surface of the base layer 102 is exposed, followed by removal of the resist 4. In this etching process, the sides of the emitter layer 103 are etched so that the width of the emitter layer 103 becomes narrower than the width of the insulating film 2 included in the dummy emitter electrode 30.

In the step of FIG. 1(c), a resist pattern 41 is formed on the base layer 102. The resist pattern 41 has an opening opposite a region of the base layer 102 including a region where the emitter layer 103 is left under the dummy emitter electrode 30 and regions adjacent to the emitter layer 103 where base electrodes are later produced. Then, a laminated metal layer 5 for base electrodes (hereinafter referred to as base metal) comprising Ti/Mo/Au and having a thickness of 300~600 nm is deposited over the entire surface by vacuum evaporation, and the resist 41 and unnecessary portions of the base metal 5 on the resist 41 are removed by the lift-off technique. In the Ti/Mo/Au base metal 5, both the Ti layer and the Mo layer are about 30 nm thick. Since the width of the dummy emitter insulating film 2 is narrower than the width of the WSi cap film 3 and the width of the emitter layer 103 is narrower than the width of the dummy emitter insulating film 2, the base metal 5 is not deposited on the side surfaces of the dummy emitter insulating film 2 and the emitter layer 103. Therefore, base electrodes comprising the base metal 5 are produced on regions of the base layer 102 at the both sides of and adjacent to the emitter layer 103 self-alignedly with the dummy emitter electrode 30. The base metal may comprise Pt/Ti/Pt/Au.

Next, a resist (not shown) having openings on prescribed regions outside the base electrodes 5 is formed, and the base layer 102 and the collector layer 101 are etched through the openings of the resist so that the base layer 102 and the relatively low dopant concentration upper n type GaAs layer of the collector layer 101 shown in FIG. 2 are etched and the relatively high dopant concentration lower n type GaAs layer of the collector layer is exposed. Thereafter, a laminated metal layer for collector electrodes (hereinafter referred to as collector metal) comprising AuGe/Ni/Au and having a thickness of 400~500 nm is deposited by vacuum evaporation, and the resist and unnecessary portions of the collector metal on the resist are removed by the lift-off technique, producing collector electrodes 6 as shown in FIG. 1(d). In the AuGe/Ni/Au collector metal 6, both the AuGe layer and the Ni layer are about 30 nm thick.

Next, a resist 7 is applied to the entire surface in a thickness sufficient to cover the base metal 5 on the dummy emitter electrode 30, followed by etching of the resist 7 from the surface. The etching is stopped when the base metal 5 is completely exposed as shown in FIG. 1(e). In place of the etching process, the following process may be employed for the patterning of the resist 7. That is, after application of the resist 7 over the entire surface, an opening is formed in the resist 7 opposite a region including the dummy emitter electrode 30 and a little wider than the electrode 30 using a photolithographic technique and, thereafter, the resist 7 is deformed by heating so that the side surfaces of the resist 7 in the opening are closely adhered to the both sides of the dummy emitter electrode 30.

Thereafter, the base metal 5 on the surface of the resist 7 is removed by ion milling, the WSi cap layer 3 is removed by RIE, and the dummy emitter insulating film 2 is removed by wet etching to expose the surface of the emitter layer 103. As a result of the etching, the resist 7 has an opening produced by the removal of the dummy emitter electrode.

In the step of FIG. 1(f), a metal layer 21 for an emitter electrode (hereinafter referred to as emitter metal) comprising a refractory metal, such as WSi, and having a thickness of 300–400 nm is deposited over the entire surface by sputtering. Thereafter, a resist 71 is formed on the emitter metal 21 opposite a region including the opening of the resist 7 and a little wider than the opening using conventional photolithography. Further, using the resist 71 as a mask, the emitter metal 21 is etched by RIE, followed by removal of the resists 7 and 71.

Figure 3:
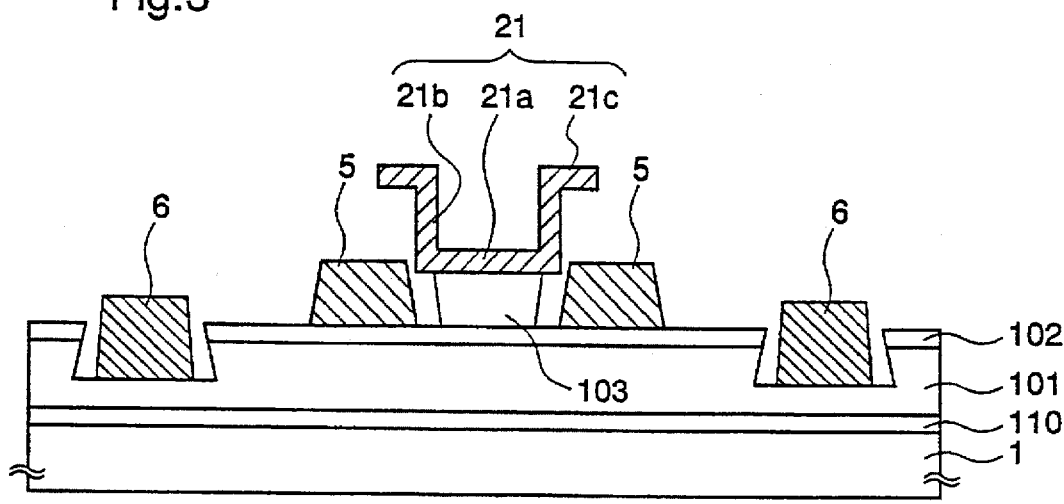
FIG. 3 is a cross-sectional view of an HBT in accordance with the first embodiment of the present invention.

As a result, the HBT shown in FIG. 3 is fabricated. In this HBT, the emitter electrode 21 comprises a planar bottom part 21a that contacts the entire top surface of the emitter layer 103 at a portion of its lower surface, a peripheral side part 21b extending upward from the peripheral portion of the bottom part 21a, and an upper fringe part 21c protruding outward from the upper end of the side part 21 in a direction perpendicular to the side part 21b. The base electrodes 5 are produced self-alignedly with the bottom part 21a of the emitter electrode 21 and the emitter layer 103.

In this first embodiment of the present invention, the size of the emitter layer 103 is reduced by reducing the size of the dummy emitter electrode 30. Although the bottom part 21a of the emitter electrode 21 is reduced with the reduction in the size of the emitter electrode 21, the distance between the opposed outer ends of the upper fringe part 21c of the emitter electrode 21 is determined by the width of the resist 71 independently of the width of the bottom part 21a. When the width of the resist 71 is increased appropriately, an air-bridge wiring is easily connected to the emitter electrode. Therefore, in contrast to the prior art HBT, reductions in the sizes of the emitter layer 103 and the emitter electrode 21 are not restricted by the resolution limit and the alignment precision of photolithography for forming the contact hole on the emitter electrode and the alignment precision of photolithography for forming the air-bridge wiring on the contact hole. As a result, the emitter layer 103 and the emitter electrode 21 can be reduced in size compared with the prior art HBT, whereby capacitance is reduced, resulting in improved high-frequency characteristics of the HBT.

Further, in this first embodiment of the invention, since vacuum evaporation and lift-off techniques are not employed for formation of the emitter electrode 21, the emitter electrode 21 with no burr is formed with high stability. In addition, since the emitter electrode 21 comprises a refractory metal, such as WSi, unwanted reaction between the emitter electrode and the emitter layer during the operation of the HBT is suppressed, whereby the reliability of the HBT is improved.

Furthermore, since the emitter layer 103 is formed self-alignedly with the dummy emitter electrode 30, it is self-aligned with the bottom part 21a of the emitter electrode 21. Therefore, the relative positions of the emitter layer 103 and the bottom part 21 of the emitter electrode 21 are not changed. Further, since the base electrodes 5 are formed self-alignedly with the emitter layer 103 and the bottom part 21a of the emitter electrode 21, the distance between the base electrode and the emitter layer 103 is not changed. Thereby, the fabricating process is reliable, and the uniformity of the electrical characteristics of the HBT is improved.

The refractory metal used for the emitter metal 21 is not restricted to WSi. For example, TiSi or TiN may be used. Alternatively, a laminated metal layer comprising Ti/Mo/Au and having a thickness of 300–400 nm may be used for the emitter metal 21. In this case, both the Ti layer and the Mo layer are 30–50 nm thick.

[Embodiment 2]

FIGS. 4(a)–4(h) are cross-sectional views illustrating process steps in a method of fabricating an HBT in accordance with a second embodiment of the present invention. In the figures, the same reference numerals as those in FIGS. 1(a)–1(f) designate the same or corresponding parts.

Figure 4:
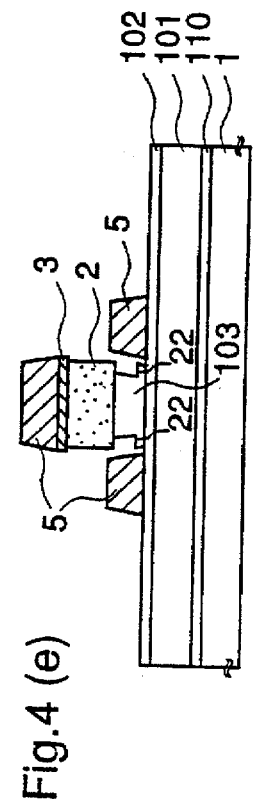
FIGS. 4(a)–4(h) are cross-sectional views illustrating process steps in a method of fabricating an HBT in accordance with a second embodiment of the present invention.
Figure 4:
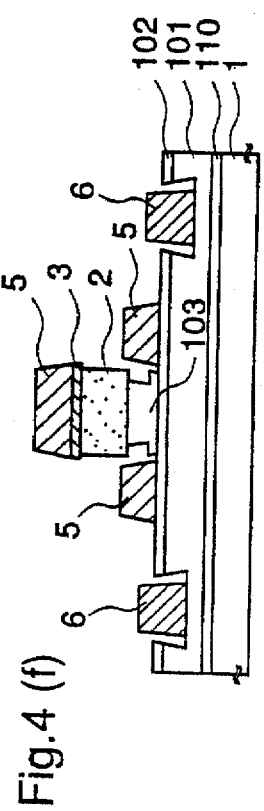
Figure 4:
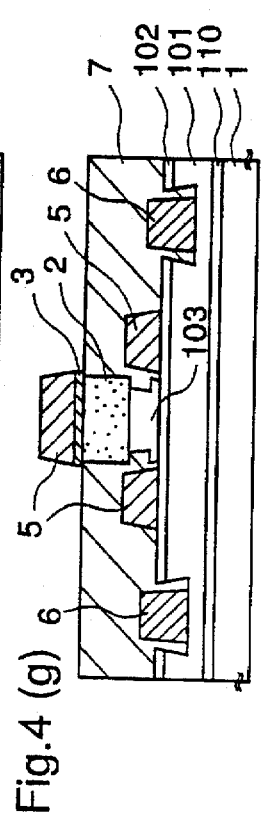
Figure 4:
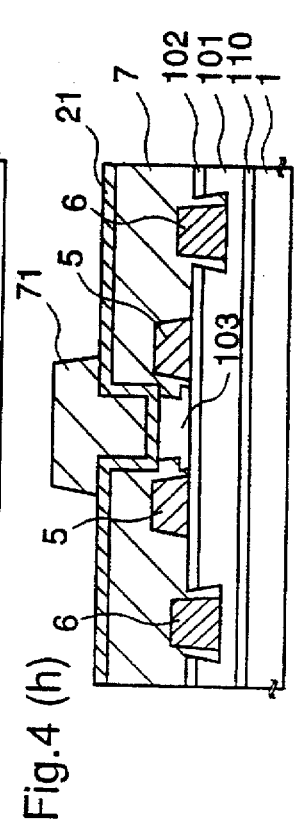
Figure 4:
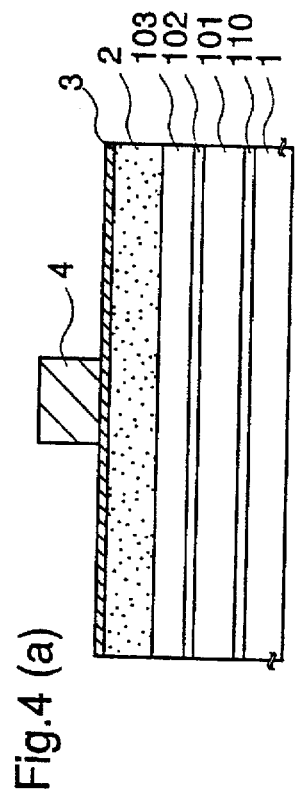
Figure 4:
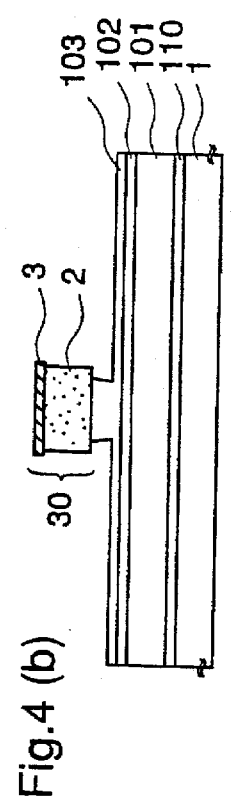
Figure 4:
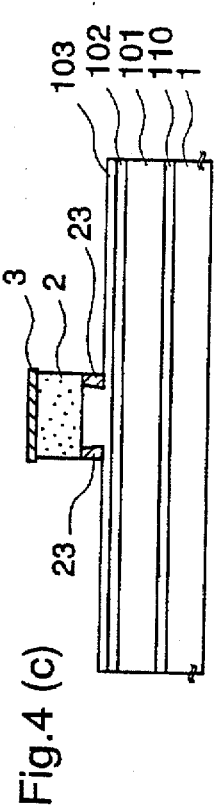
Figure 4:
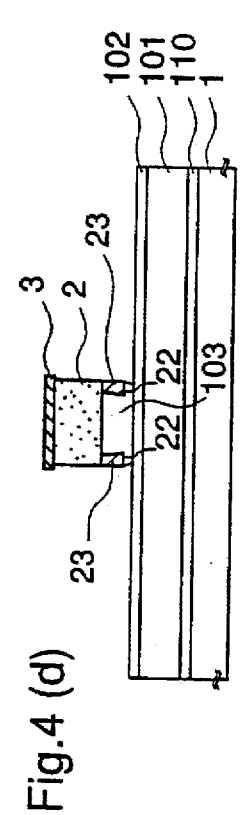

Initially, as illustrated in FIG. 4(a), a buffer layer 110, a collector layer 101, a base layer 102, and an emitter layer 103 are epitaxially grown on an undoped GaAs substrate 1 in this order. The structure of these semiconductor layers epitaxially grown on the substrate 1 is as shown in FIG. 2. Then, an insulating film 2 for a dummy emitter electrode (hereinafter referred to as dummy emitter insulating film) and a cap film 3 are deposited on the emitter layer 103. Preferably, the dummy emitter insulating film 2 comprises SiON and has a thickness not exceeding 2 μm, and the cap film 3 comprises WSi and has a thickness not exceeding 500 nm. The deposition method is CVD or sputtering. Thereafter, a resist 4 is formed on a region where a dummy emitter electrode will be formed.

In the step of FIG. 4(b), using the resist 4 as a mask, the WSi cap film 3 is etched by RIE. Further, using the resist 4 and the WSi cap film 3 as masks, the dummy emitter insulating film 2 is etched by RIE. In this etching process, the sides of the insulating film 2 are etched so that the width of the insulating film 2 becomes narrower than the width of the WSi cap film 3. Thereafter, the resist 4 is removed. As a result of the etching, a dummy emitter electrode 30 comprising the WSi cap film 3 and the dummy emitter insulating film 2 is produced. The process steps described above are identical to those already described in the first embodiment of the invention.

In the step of FIG. 4(b), using the dummy emitter electrode 30 as a mask, the emitter layer 103 is etched to a prescribed depth with an etchant such as tartaric acid, producing an upper layer of the emitter layer 103 just under the dummy emitter electrode 30. In this etching process, the sides of the side surfaces of the upper layer of the emitter layer 103 are etched so that the width of the upper layer becomes narrower than the width of the insulating film 2 included in the dummy emitter electrode 30. In other words, the side surfaces of the upper layer of the emitter layer 103 are recessed toward the center from the side surfaces of the dummy emitter insulating film 2 by a certain distance. Thereafter, a resist 23 is applied to the entire surface and etched by an anisotropic etching technique, such as $O_2$ RIE, leaving portions on the side surfaces of the upper layer of the emitter layer which are recessed toward the center from the side surfaces of the dummy emitter insulating film 2 as shown in FIG. 4(c). The position of the outer side surface of the left portion of the resist 23 is aligned with or a little further recessed than the position of the side surface of the dummy emitter insulating film 2.

In the step of FIG. 4(d), using the dummy emitter electrode 30 and the resist 23 as masks, the emitter layer 103 remaining on a region other than the dummy emitter electrode region is etched with an etchant such as tartaric acid until the base layer 102 is exposed, producing a lower layer of the emitter layer that is wider than the upper layer of the emitter layer. Thereafter, the resist 23 is removed. As a result, the emitter layer 103 left under the dummy emitter electrode 30 has a double-layer structure comprising the upper layer and the lower layer, and a difference in level is produced at the boundary between the upper layer and the lower layer on the peripheral side surface of the emitter layer 103. This part with the difference in level is called a guard ring. In FIG. 4(d), the guard ring is denoted by numeral 22.

In the step of FIG. 4(e), as in the above-described first embodiment of the invention, base electrodes 5 comprising a laminated metal layer of Ti/Mo/Au and having a thickness of 300~600 nm are produced on regions of the base layer 102 adjacent to the emitter layer 103 self-alignedly with the dummy emitter electrode 30 using photolithography, and vacuum evaporation and lift-off techniques. In the Ti/Mo/Au base metal, both the Ti layer and the Mo layer are about 30 nm thick. In place of Ti/Mo/Au, Pt/Ti/Pt/Au may be employed for the base metal.

Next, a resist (not shown) having openings on prescribed regions outside the base electrodes 5 is formed, and the base layer 102 and the collector layer 101 are etched through the openings of the resist so that the base layer 102 and the relatively low dopant concentration upper n type GaAs layer of the collector layer 101 is etched and the relatively high dopant concentration lower n type GaAs layer of the collector layer is exposed. Thereafter, a laminated metal layer for collector electrodes (hereinafter referred to as collector metal) comprising AuGe/Ni/Au and having a thickness of 400~500 nm is deposited by vacuum evaporation, and the resist and unnecessary portions of the collector metal on the resist are removed by the lift-off technique, producing collector electrodes 6 as shown in FIG. 4(f). In the AuGe/Ni/Au collector metal 6, both the AuGe layer and the Ni layer are about 30 nm thick.

Next, a resist 7 is applied to the entire surface to a thickness sufficient to cover the base metal 5 on the dummy emitter electrode 30, followed by etching of the resist 7 from the surface. The etching is stopped when the base metal 5 is completely exposed as shown in FIG. 4(g). In place of the etching process, the following process may be employed for the patterning of the resist 7. That is, after application of the resist 7 over the entire surface, an opening is formed in the resist 7 opposite a region including the dummy emitter electrode 30 and a little wider than the electrode 30 using a photolithographic technique and, thereafter, the resist 7 is deformed by heating so that the side surfaces of the resist 7 in the opening are closely adhered to both sides of the dummy emitter electrode 30.

Thereafter, the base metal 5 on the surface of the resist 7 is removed by ion milling, the WSi cap layer 3 is removed by RIE, and the dummy emitter insulating film 2 is removed by wet etching to expose the surface of the emitter layer 103. As a result of the etching, the resist 7 has an opening produced by the removal of the dummy emitter electrode.

In the step of FIG. 4(h), a metal layer 21 for an emitter electrode (hereinafter referred to as emitter metal) comprising a refractory metal, such as WSi, and having a thickness of 300~400 nm is deposited over the entire surface by sputtering. Thereafter, a resist 71 is formed on the emitter metal 21 opposite a region including the opening of the resist 7 and a little wider than the opening using conventional photolithography. Further, using the resist 71 as a mask, the emitter metal 21 is etched by RIE, followed by removal of the resists 7 and 71.

Figure 5:
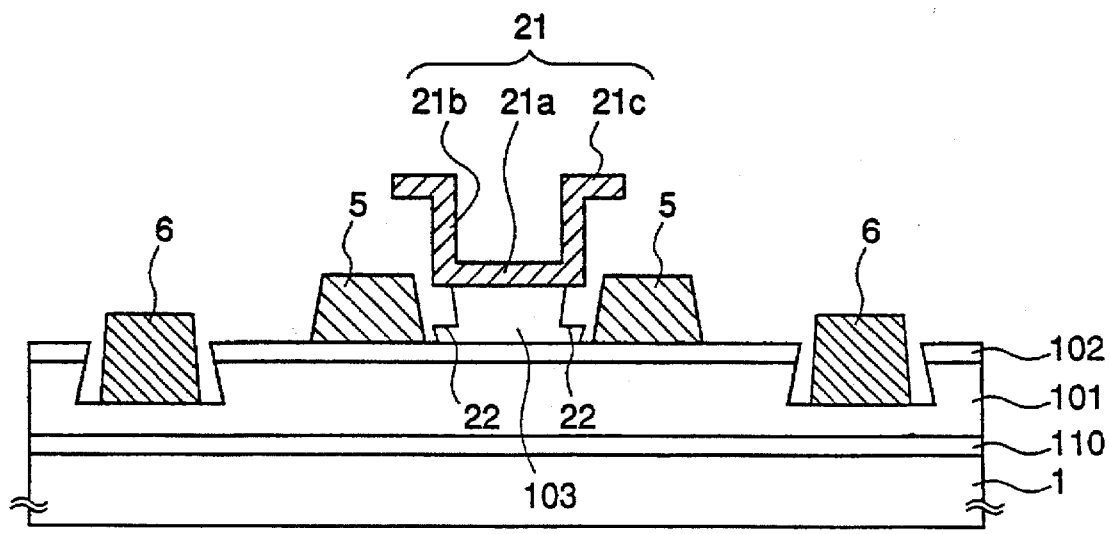
FIG. 5 is a cross-sectional view illustrating an HBT in accordance with the second embodiment of the present invention.

As a result of the above-described process steps, the HBT shown in FIG. 5 is fabricated. In this HBT, the emitter electrode 21 comprises a planar bottom part 21a that contacts the entire top surface of the emitter layer 103 at a portion of its lower surface, a peripheral side part 21b extending upward from the peripheral portion of the bottom part 21a, and an upper fringe part 21c protruding outward from the upper end of the side part 21 in a direction perpendicular to the side part 21b. The base electrodes 5 are produced self-alignedly with the bottom part 21a of the emitter electrode 21 and the emitter layer 103. In addition, the guard ring 22 is produced on the side surface of the emitter layer 103.

Also in this second embodiment of the present invention, as in the first embodiment of the invention, even when the emitter layer 103 and the bottom part 21a of the emitter electrode 21 are reduced in size, an air-bridge wiring is easily connected to the emitter electrode by appropriately increasing the distance between the opposed outer ends of the upper fringe part 21c of the emitter electrode 21. Therefore, the emitter layer and the emitter electrode can be reduced in size without being restricted by the resolution limit and the superposition precision of photolithography, whereby capacitance is reduced, resulting in an HBT operating in a higher frequency band. Further, the base electrodes 5 are produced self-alignedly with the emitter layer 103 and the bottom part 21a of the emitter electrode 21, and the distance between them is not changed, whereby the uniformity of the electrical characteristics of the HBT is improved.

Further, as in the first embodiment, since vacuum evaporation and lift-off techniques are not employed for formation of the emitter electrode 21, the emitter electrode 21 is formed with high stability. In addition, since the emitter electrode 21 comprises a refractory metal, such as WSi, an unwanted reaction between the emitter electrode and the emitter layer during the operation of the HBT is suppressed, whereby the reliability of the HBT is improved.

Further, as in the first embodiment, emitter layer 103 is formed self-alignedly with the bottom part 21a of the emitter electrode 21 and the base electrodes 5 are formed self-alignedly with the emitter layer 103 and the bottom part 21a of the emitter electrode 21. Therefore, the fabricating process is reliable, and the uniformity of the electrical characteristics of the HBT is improved.

Furthermore, in this second embodiment of the invention, since the guard ring 22 is produced on the peripheral side surface of the emitter layer 103, it is possible to suppress surface leakage current that flows across the emitter electrode 21 and the base electrode 5 through the side surface of the emitter layer 103. This effect is confirmed on experiment and it is thought that a surface depletion layer produced in the protruding part of the guard ring 22 suppresses the surface leakage current. Thereby, the current amplification factor of the HBT is increased. Therefore, the high-frequency characteristics of the HBT are further improved by the reduced capacitance due to the reduction in the emitter size and the increased current amplification factor.

The refractory metal used for the emitter metal 21 is not restricted to WSi. For example, TiSi or TiN may be used.

Alternatively, a laminated metal layer comprising Ti/Mo/Au and having a thickness of 300–400 nm may be used for the emitter metal 21. In this case, both the Ti layer and the Mo layer are 30–50 nm thick.

[Embodiment 3]

FIGS. 6(a)–6(g) are cross-sectional views illustrating process steps in a method of fabricating an HBT in accordance with a third embodiment of the present invention. In these figures, the same reference numerals as those in FIGS. 1(a)–1(f) designate the same or corresponding parts.

Figure 6:
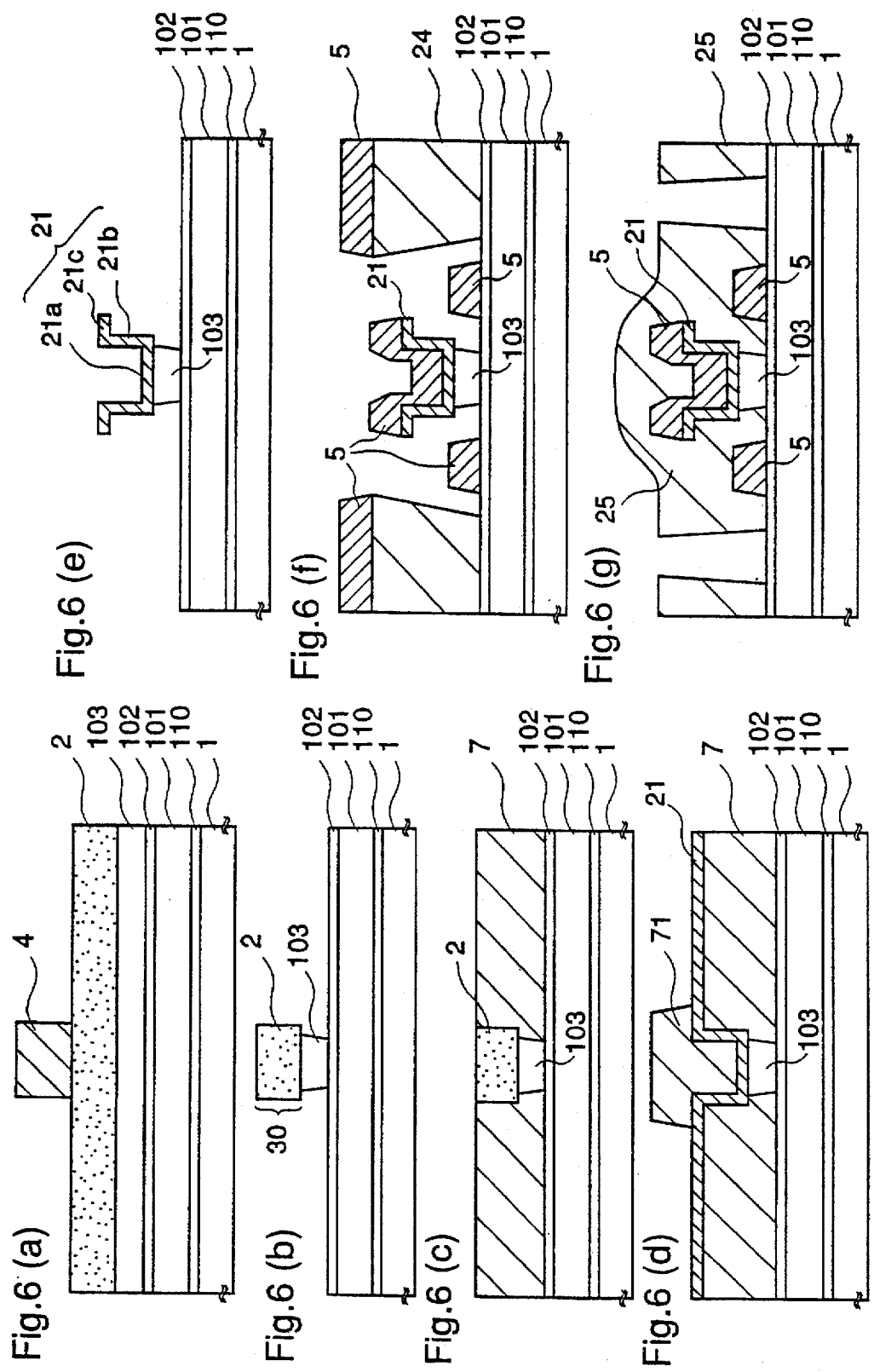
FIGS. 6(a)–6(g) are cross-sectional views illustrating process steps in a method of fabricating an HBT in accordance with a third embodiment of the present invention.

Initially, as illustrated in FIG. 6(a), a buffer layer 110, a collector layer 101, a base layer 102, and an emitter layer 103 are epitaxially grown on an undoped GaAs substrate 1 in this order. The structure of the semiconductor layers epitaxially grown on the substrate 1 is as illustrated in FIG. 2. Thereafter, an insulating film 2 for a dummy emitter electrode (hereinafter referred to as dummy emitter insulating film) is deposited on the emitter layer 103. Preferably, the dummy emitter insulating film 2 comprises SiON and has a thickness not exceeding 2 μm, and the deposition method is CVD or sputtering. Then, a resist 4 is formed by photolithography on a region where a dummy emitter electrode will be formed.

In the step of FIG. 6(b), using the resist 4 as a mask, the dummy emitter insulating film 2 is etched by RIE, producing a dummy emitter electrode 30 comprising the insulating film 2. Further, using the dummy emitter electrode 30 as a mask, the emitter layer 103 is etched with an etchant, such as tartaric acid, until the surface of the base layer 102 is exposed, followed by removal of the resist 4.

Thereafter, a resist 7 is applied to the entire surface to a thickness sufficient to cover the dummy emitter electrode 30, followed by etching of the resist 7 from the surface. The etching is stopped when the upper surface of the dummy emitter electrode 30 is exposed as shown in FIG. 6(c). In place of the etching process, the following process may be employed for the patterning of the resist 7. That is, after application of the resist 7 over the entire surface, an opening is formed in the resist 7 opposite a region including the dummy emitter electrode 30 and a little wider than the electrode 30 using a photolithographic technique and, thereafter, the resist 7 is deformed by heating so that side surfaces of the resist 7 in the opening are closely adhered to both sides of the dummy emitter electrode 30.

Thereafter, the dummy emitter insulating film 2 exposed at the surface of the resist 7 is removed by wet etching to expose the surface of the emitter layer 103. As a result of the etching, the resist 7 has an opening produced by the removal of the dummy emitter electrode 30. Then, a metal layer 21 for an emitter electrode (hereinafter referred to as emitter metal) comprising a refractory metal, such as WSi, and having a thickness of 300–400 nm is deposited over the entire surface by sputtering. Thereafter, a resist 71 is formed on the emitter metal 21 opposite a region including the opening of the resist 7 and a little wider than the opening using conventional photolithography as shown in FIG. 6(d). Further, as shown in FIG. 6(e), using the resist 71 as a mask, the emitter metal 21 is etched by RIE, followed by removal of the resists 7 and 71, thereby producing an emitter electrode 21. The emitter electrode 21 comprises a planar bottom part 21a that contacts the entire top surface of the emitter layer 103 at a portion of its lower surface, a peripheral side part 21b extending upward from the peripheral portion of the bottom part 21a, and an upper fringe part 21c protruding outward from the upper end of the side part 21 in the direction perpendicular to the side part 21b.

In the step of FIG. 6(f), a resist pattern 24 is formed on the base layer 102. The resist pattern 24 has an opening opposite a region of the base layer 102 including a region where the emitter electrode 21 is present and regions adjacent to the emitter electrode 21 where base electrodes are later produced. Then, a laminated metal layer 5 for base electrodes (hereinafter referred to as base metal) comprising Ti/Mo/Au and having a thickness of 300–600 nm is deposited over the entire surface by vacuum evaporation, and the resist 41 and unnecessary portions of the base metal 5 on the resist 41 are removed by the lift-off technique. In the Ti/Mo/Au base metal 5, both the Ti layer and the Mo layer are about 30 nm thick. Since the width of the upper fringe part 21c of the emitter electrode 21 is wider than the width of the bottom part 21a of the emitter electrode 21 and the width of the emitter layer 103, the base metal 5 is not deposited on the side surfaces of the emitter electrode 21 and the emitter layer 103. Therefore, base electrodes comprising the base metal 5 are produced on regions of the base layer 102 at the both sides of and adjacent to the emitter layer 103 self-alignedly with the upper fringe part 21c of the emitter electrode 21. The base metal may comprise Pt/Ti/Pt/Au.

Figure 7:
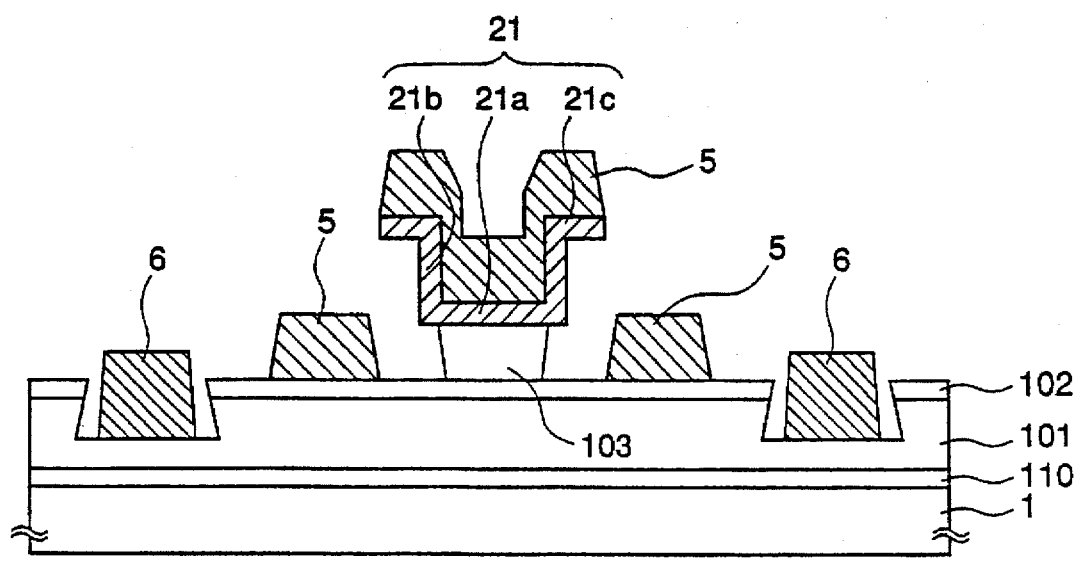
FIG. 7 is a cross-sectional view illustrating an HBT in accordance with the third embodiment of the present invention.

In the step of FIG. 6(g), a resist 25 having openings on prescribed regions outside the base electrodes 5 is formed. Thereafter, the base layer 102 and the collector layer 101 are etched through the openings of the resist so that the base layer 102 and the relatively low dopant concentration upper n type GaAs layer of the collector layer 101 shown in FIG. 2 are etched and the relatively high dopant concentration lower n type GaAs layer of the collector layer is exposed. Thereafter, a laminated metal layer for collector electrodes (hereinafter referred to as collector metal) comprising AuGe/Ni/Au and having a thickness of 400–500 nm is deposited by vacuum evaporation, and the resist 25 and unnecessary portions of the collector metal on the resist are removed by the lift-off technique, producing collector electrodes 6. In the AuGe/Ni/Au collector metal 6, both the AuGe layer and the Ni layer are about 30 nm thick. As a result of the above-described process steps, the HBT shown in FIG. 7 is fabricated.

Also in this third embodiment of the invention, as in the first and second embodiments, even when the emitter layer 103 and the bottom part 21a of the emitter electrode 21 are reduced in size, since the distance between the opposed outer ends of the upper fringe part 21c of the emitter electrode 21 can be made larger than the width of the bottom part 21a of the emitter electrode 21, an air-birdge wiring can be easily connected to the emitter electrode. Therefore, the emitter layer and the emitter electrode can be reduced in size without being restricted by the resolution limit and the superposition precision of photolithography, whereby capacitance is reduced, resulting in an HBT operating in a higher frequency band.

Further, as in the first and second embodiments, since vacuum evaporation and lift-off techniques are not employed for formation of the emitter electrode 21, the emitter electrode 21 is formed with high stability. In addition, since the emitter electrode 21 comprises a refractory metal, such as WSi, unwanted reaction between the emitter electrode and the emitter layer during the operation of the HBT is suppressed, whereby the reliability of the HBT is improved.

Further, as in the first and second embodiments, since the emitter layer 103 is formed self-alignedly with the bottom part 21a of the emitter electrode 21, the fabricating process is reliable and the uniformity of the electrical characteristics of the HBT is improved.

Furthermore, in this third embodiment, since the base electrodes 5 are formed self-alignedly with the upper fringe part 21c of the emitter electrode 21, the distance between the base electrode 5 and the bottom part 21a of the emitter electrode 21 or the distance between the base electrode 5 and the emitter layer 103 disposed beneath the emitter electrode 21 can be changed by changing the width of the upper fringe part 21c of the emitter electrode 21, whereby the degree of freedom in the design of the HBT is increased.

Also in this third embodiment of the invention, the refractory metal used for the emitter metal 21 is not restricted to WSi. For example, TiSi or TiN may be used. Alternatively, a laminated metal layer comprising Ti/Mo/Au and having a thickness of 300–400 nm may be used for the emitter metal 21. In this case, both the Ti layer and the Mo layer are 30–50 nm thick.

[Embodiment 4]

FIGS. 8(a)–8(h) are cross-sectional views illustrating process steps in a method of fabricating an HBT in accordance with a fourth embodiment of the present invention. In these figures, the same reference numerals as those in FIGS. 1(a)–1(f) designate the same or corresponding parts.

Initially, as illustrated in FIG. 8(a), a buffer layer 110, a collector layer 101, a base layer 102, and an emitter layer 103 are epitaxially grown on an undoped GaAs substrate 1 in this order. The structure of the semiconductor layers epitaxially grown on the substrate 1 is as illustrated in FIG. 2. Thereafter, an insulating film 2 for a dummy emitter electrode (hereinafter referred to as dummy emitter insulating film) is deposited on the emitter layer 103. Preferably, the dummy emitter insulating film 2 comprises SiON and has a thickness not exceeding 2 μm, and the deposition method is CVD or sputtering. Then, a resist 4 is formed by photolithography on a region where a dummy emitter electrode is later formed. Using the resist 4 as a mask, the dummy emitter insulating film 2 is etched by RIE, producing a dummy emitter electrode 30 comprising the insulating film 2.

Next, the same process steps as those for producing the guard ring of the emitter layer described in the second embodiment of the invention are carried out. That is, as illustrated in FIG. 8(b), using the dummy emitter electrode 30 as a mask, the emitter layer 103 is etched to a prescribed depth with an etchant, such as tartaric acid, producing an upper layer of the emitter layer 103 just under the dummy emitter electrode 30. In this etching process, side etching is given to the side surfaces of the upper layer of the emitter layer 103 so that the width of the upper layer becomes narrower than the width of the insulating film 2 included in the dummy emitter electrode 30. In other words, the side surfaces of the upper layer of the emitter layer 103 are recessed toward the center from the side surfaces of the dummy emitter insulating film 2 by a certain distance. After the etching process, the resist 4 is removed. Then, a resist 23 is applied to the entire surface and etched by an anisotropic etching technique, such as O₂ RIE, leaving portion on the side surfaces of the upper layer of the emitter layer which are recessed toward the center from the side surfaces of the dummy emitter insulating film 2, as shown in FIG. 8(c). The position of the outer side surface of the left portion of the resist 23 is aligned with or is a little inward than the position of the side surface of the dummy emitter insulating film 2. Using the dummy emitter electrode 30 and the resist 23 as masks, the emitter layer 103 remaining on a region other than the dummy emitter electrode region is etched with an etchant, such as tartaric acid, until the base layer 102 is exposed, producing a lower layer of the emitter layer that is wider than the upper layer of the emitter layer. Thereafter, the resist 23 is removed. As a result, the emitter layer 103 left under the dummy emitter electrode 30 has a double-layer structure comprising the upper layer and the lower layer, and a difference in level, i.e., a guard ring, is produced at the boundary between the upper layer and the lower layer on the peripheral side surface of the emitter layer 103.

The process steps hereinafter are identical to those already described in the third embodiment of the invention. That is, a resist 7 is applied to the entire surface to a thickness sufficient to cover the dummy emitter electrode 30, followed by etching of the resist 7 from the surface. The etching is stopped when the upper surface of the dummy emitter electrode 30 is exposed as shown in FIG. 8(d). In place of the etching process, the following process may be employed for the patterning of the resist 7. That is, after application of the resist 7 over the entire surface, an opening is formed in the resist 7 opposite a region including the dummy emitter electrode 30 and a little wider than the electrode 30 using a photolithographic technique and, thereafter, the resist 7 is deformed by heating so that the side surfaces of the resist 7 in the opening are closely adhered to both sides of the dummy emitter electrode 30.

Thereafter, the dummy emitter insulating film 2 exposed at the surface of the resist 7 is removed by wet etching to expose the surface of the emitter layer 103. As a result of the etching, the resist 7 has an opening produced by the removal of the dummy emitter electrode 30. Then, a metal layer 21 for an emitter electrode (hereinafter referred to as emitter metal) comprising a refractory metal, such as WSi, and having a thickness of 300–400 nm is deposited over the entire surface by sputtering. Thereafter, a resist 71 is formed on the emitter metal 21 opposite a region including the opening of the resist 7 and a little wider than the opening using conventional photolithography as shown in FIG. 8(e). Further, as shown in FIG. 8(f), using the resist 71 as a mask, the emitter metal 21 is etched by RIE, followed by removal of the resists 7 and 71, thereby producing an emitter electrode 21. The emitter electrode 21 comprises a planar bottom part 21a that contacts the entire top surface of the emitter layer 103 at a portion of its lower surface, a peripheral side part 21b extending upward from the peripheral portion of the bottom part 21a, and an upper fringe part 21c protruding outward from the upper end of the side part 21 in a direction perpendicular to the side part 21b.

In the step of FIG. 8(g), a resist pattern 24 is formed on the base layer 102. The resist pattern 24 has an opening opposite a region of the base layer 102 including a region where the emitter electrode 21 is present and regions adjacent to the emitter electrode 21 where base electrodes are later produced. Then, a laminated metal layer 5 for base electrodes (hereinafter referred to as base metal) comprising Ti/Mo/Au and having a thickness of 300–600 nm is deposited over the entire surface by vacuum evaporation, and the resist 41 and unnecessary portions of the base metal 5 on the resist 41 are removed by the lift-off technique. In the Ti/Mo/Au base metal 5, both the Ti layer and the Mo layer are about 30 nm thick. Since the width of the upper fringe part 21c of the emitter electrode 21 is wider than the width of the bottom part 21a of the emitter electrode 21 and the width of the emitter layer 103, the base metal 5 is not deposited on the side surfaces of the emitter electrode 21 and the emitter layer 103. Therefore, base electrodes comprising the base metal 5 are produced on regions of the base layer 102 at both sides of and adjacent to the emitter layer 103 self-alignedly with the upper fringe part 21c of the emitter electrode 21. The base metal may comprise Pt/Ti/Pt/Au.

Figure 9:
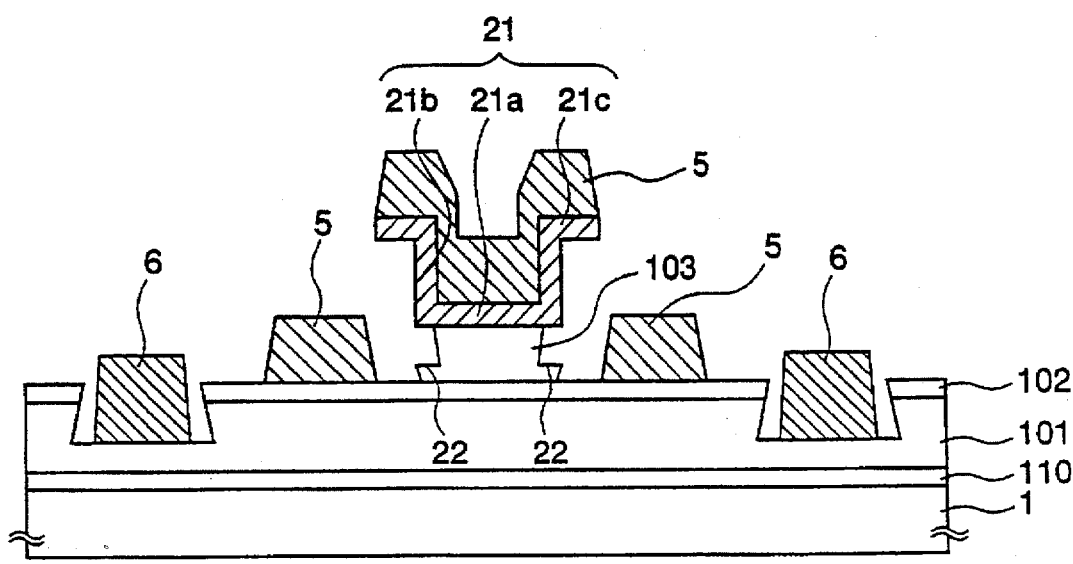
FIG. 9 is a cross-sectional view illustrating an HBT in accordance with the fourth embodiment of the present invention.

In the step of FIG. 8(h), a resist 25 having openings on prescribed regions outside the base electrodes 5 is formed. Thereafter, the base layer 102 and the collector layer 101 are etched through the openings of the resist so that the base layer 102 and the relatively low dopant concentration upper n type GaAs layer of the collector layer 101 shown in FIG. 2 are etched and the relatively high dopant concentration lower n type GaAs layer of the collector layer is exposed. Thereafter, a laminated metal layer for collector electrodes (hereinafter referred to as collector metal) comprising AuGe/Ni/Au and having a thickness of 400–500 nm is deposited by vacuum evaporation, and the resist 25 and unnecessary portions of the collector metal on the resist are removed by the lift-off technique, producing collector electrodes 6. In the AuGe/Ni/Au collector metal 6, both the AuGe layer and the Ni layer are about 30 nm thick. As a result of the above-described process steps, the HBT shown in FIG. 9 is fabricated.

Also in this fourth embodiment of the invention, as in the first to third embodiments, even when the emitter layer 103 and the bottom part 21a of the emitter electrode 21 are reduced in size, since the distance between the opposed outer ends of the upper fringe part 21c of the emitter electrode 21 can be made larger than the width of the bottom part 21a of the emitter electrode 21, an air-birdge wiring can be easily connected to the emitter electrode. Therefore, the emitter layer and the emitter electrode can be reduced in size without being restricted by the resolution limit and the superposition precision of photolithography, whereby capacitance is reduced, resulting in an HBT operating in a higher frequency band.

Further, as in the above-described first to third embodiments, since vacuum evaporation and lift-off techniques are not employed for formation of the emitter electrode 21, the emitter electrode 21 with no burr is formed with high stability. In addition, since the emitter electrode 21 comprises a refractory metal, such as WSi, unwanted reaction between the emitter electrode and the emitter layer during the operation of the HBT is suppressed, whereby the reliability of the HBT is improved.

Further, as in the first to third embodiments, since the emitter layer 103 is formed self-alignedly with the bottom part 21a of the emitter electrode 21, the fabricating process is reliable and the uniformity of the electrical characteristics of the HBT is improved.

Furthermore, as in the third embodiment, since the base electrodes 5 are formed self-alignedly with the upper fringe part 21c of the emitter electrode 21, the distance between the base electrode 5 and the bottom part 21a of the emitter electrode 21 or the distance between the base electrode 5 and the emitter layer 103 disposed beneath the emitter electrode 21 can be changed by changing the width of the upper fringe part 21c of the emitter electrode 21, whereby the degree of freedom in the design of the HBT is increased.

Furthermore, as in the second embodiment of the invention, since the guard ring 22 is produced on the peripheral side surface of the emitter layer 103, it is possible to suppress surface leakage current that flows across the emitter electrode 21 and the base electrode 5 through the side surface of the emitter layer 103, whereby the current amplification factor of the HBT is increased. Therefore, the high-frequency characteristics of the HBT are further improved by the reduced capacitance due to the reduction in the emitter size and the increased current amplification factor.

Also in this fourth embodiment of the invention, the refractory metal used for the emitter metal 21 is not restricted to WSi. For example, TiSi or TiN may be used. Alternatively, a laminated metal layer comprising Ti/Mo/Au and having a thickness of 300–400 nm may be used for the emitter metal 21. In this case, both the Ti layer and the Mo layer are 30–50 nm thick.

[Embodiment 5]

Figure 10:
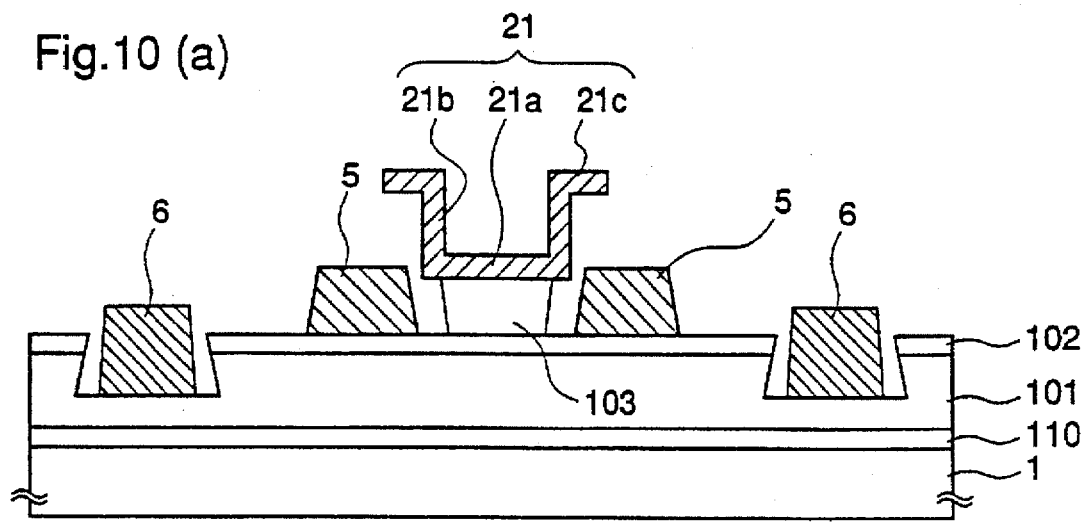
FIGS. 10(a)–10(c) are cross-sectional views illustrating process steps in a method of fabricating an HBT in accordance with a fifth embodiment of the present invention.
Figure 10:
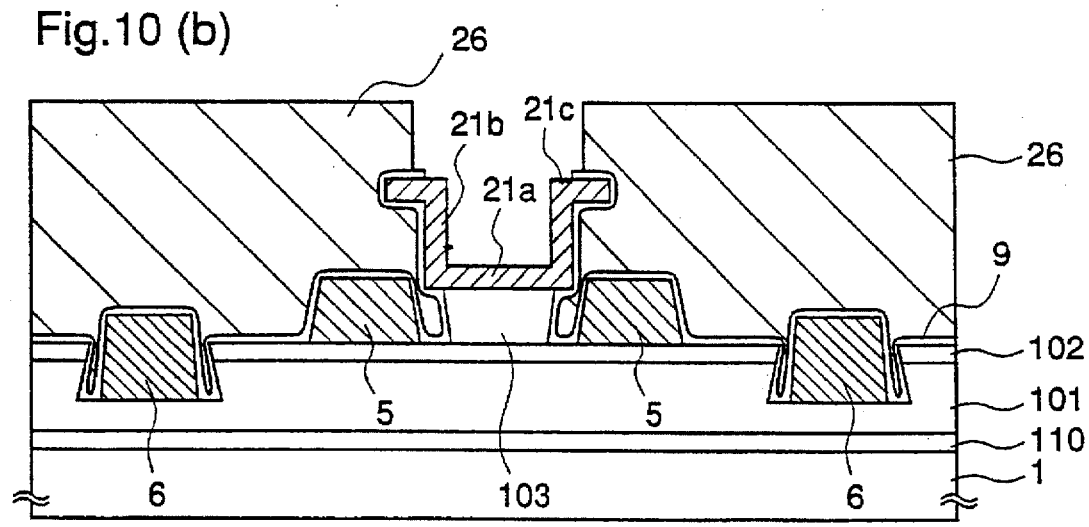
Figure 10:
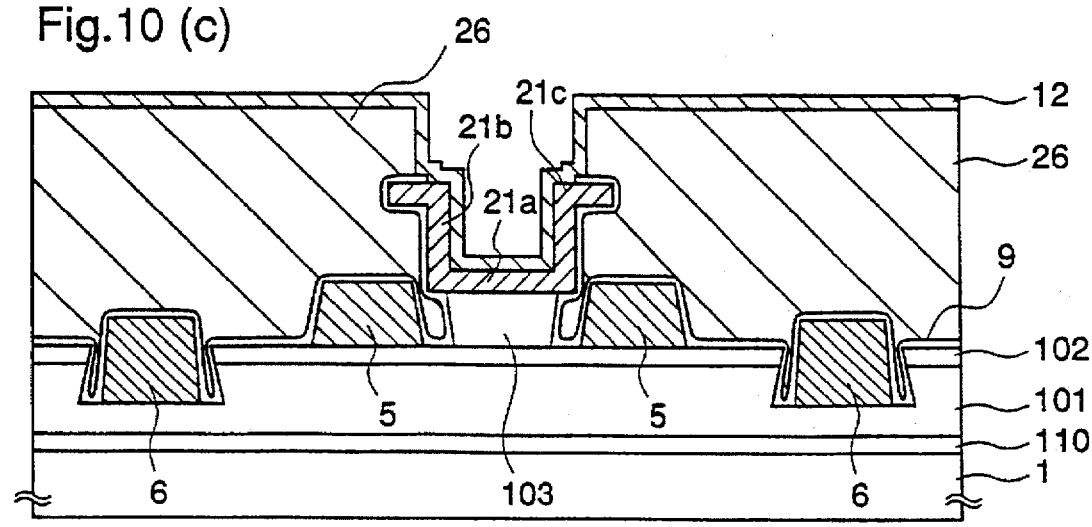

In this fifth embodiment of the present invention, an air-bridge wiring is connected to an emitter electrode of an HBT according to any of the first to fourth embodiments of the invention. FIGS. 10(a)–10(c) are cross-sectional views illustrating process steps for fabricating the air-bridge wiring. Initially, an HBT shown in FIG. 10(a) is fabricated using the process steps according to the first embodiment of the invention. This HBT is identical to the HBT shown in FIG. 3. Next, a protective film 9 comprising SiON and having a thickness not exceeding 200 nm is deposited over the entire surface, and the portion of the protective film 9 on the surface of the emitter electrode 21, except on the upper fringe part 21c, is removed using photolithography and etching techniques, producing an opening in the protective film 9 to expose the emitter electrode 21. Further, a resist 26 having an opening opposite a region including the opening of the protective film 9 and inside the edge of the upper fringe part 21c of the emitter electrode 21 is formed as shown in FIG. 10(b). Thereafter, as illustrated in FIG. 10(c), a feeding layer 12 for electroplating comprising Ti/Au is deposited by sputtering. The thickness of the Ti layer is about 50 nm. Then, the feeding layer 12 is masked with a resist except a region where an air-bridge wiring is later produced and including the opening of the resist 26. Thereafter, an Au layer 13 is electroplated on the unmasked region of the feeding layer 12 to a thickness about 2 μm, followed by removal of the resist from the feeding layer 12. Subsequently, the exposed feeding layer 12, i.e., the feeding layer 12 on which no Au layer is plated, is removed by ion milling, followed by removal of the resist 26. Thereby, an air-bridge wiring 11 comprising the feeding layer 12 and the plated Au layer 13 is fabricated.

Figure 11:
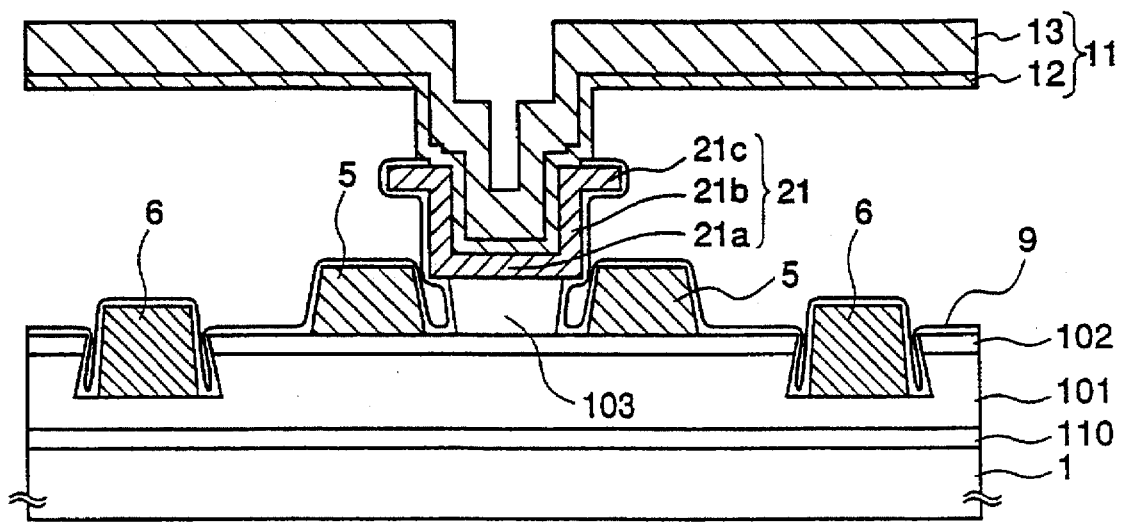
FIG. 11 is a cross-sectional view illustrating an HBT in accordance with the fifth embodiment of the present invention.

As a result of the above-described process steps, an HBT having the air-bridge wiring 11 connected to the emitter electrode 21 is fabricated as shown in FIG. 11.

In the above-described method of fabricating an HBT, the process steps for fabricating the emitter layer, the emitter electrode, and the base electrodes are identical to those according to the first embodiment of the invention. However, a similar air-bridge structure connected to the emitter electrode as that shown in FIG. 11 is obtained even when the emitter layer, the emitter electrodes, and the base electrodes are fabricated in the process steps according to any of the second to fourth embodiments of the invention.

In this fifth embodiment of the invention, as in the first to fourth embodiments of the invention, a highly reliable emitter electrode is fabricated with high stability. Even when the emitter layer 103 and the bottom part 21a of the emitter electrode 21 are reduced in size, since the upper fringe part 21c of the emitter electrode 21 can be made wider than the emitter layer 103 and the bottom part 21a, the width of the opening of the resist 26 can be increased appropriately with and increase in the width of the upper fringe part 21c. Further, the distance between the edge of the opening of the protective film 9 and the edge of the upper fringe part 21c of the emitter electrode, i.e., a region of the surface of the upper fringe part 21c where the protective film is a sufficient left, is margin depends on the superposition precision of the photolithography in forming the opening of the protective film 9 on the upper fringe part 21c of the emitter electrode 21 and the superposition precision of the photolithography in forming the opening of the resist 26 on the opening of the protective film 9. Therefore, the air-bridge wiring 11 directly connected to the emitter electrode 21 is fabricated with high stability in a relatively simple process. Since the air-bridge wiring 11 is employed, the capacitance of the wiring is reduced, whereby the HBT is operated in a higher frequency band. In addition, heat generated in the HBT is dissipated through the emitter electrode 21 and the air-bridge wiring 11 with high efficiency.

Furthermore, as in the first to fourth embodiments, since the emitter layer 103 is produced self-alignedly with the bottom part 21a of the emitter electrode 21, the fabricating process is simplified and the uniformity of the electrical characteristics of the HBT is improved.

Also in this fifth embodiment of the invention, the refractory metal used for the emitter metal 21 is not restricted to WSi. For example, TiSi or TiN may be used. Alternatively, a laminated metal layer comprising Ti/Mo/Au and having a thickness of 300–400 nm may be used for the emitter metal 21. In this case, both the Ti layer and the Mo layer are 30–50 nm thick.

Further, a guard ring as described in the second and fourth embodiments of the invention may be formed on the side surface of the emitter layer 103.

[Embodiment 6]

In this sixth embodiment of the present invention, in the HBT according to an first or second embodiment of the invention, the emitter electrode and the air-bridge wiring connected to the emitter electrode are united in one body. FIGS. 12(a)–12(f) are cross-sectional views illustrating process steps in a method of fabricating an HBT according to the sixth embodiment of the invention. The process steps up to the removal of the dummy emitter electrode 30 shown in FIGS. 12(a)–12(e) are identical to those already described with respect to FIGS. 1(a)–1(e) and, therefore, repeated description is not necessary.

Figure 13:
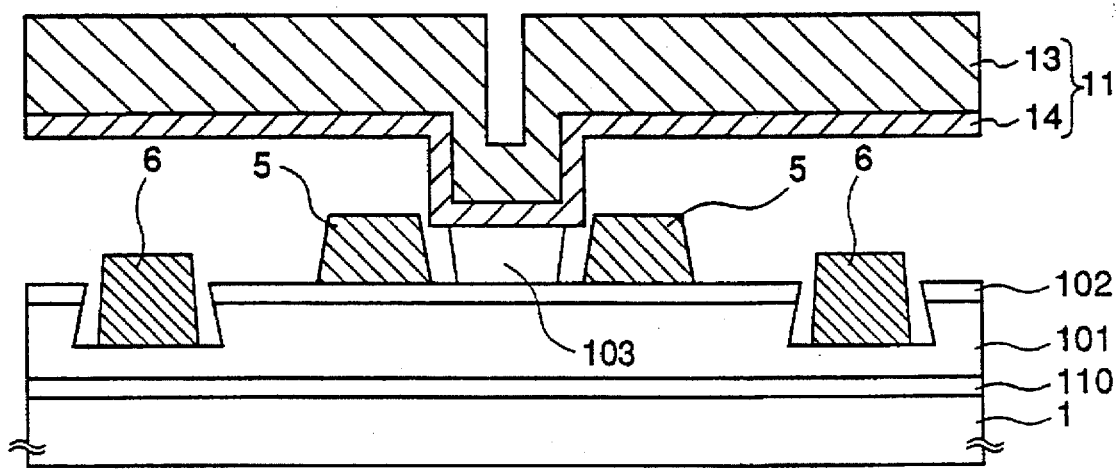
FIG. 13 is a cross-sectional view illustrating an HBT in accordance with the sixth embodiment of the present invention.

After removal of the dummy emitter electrode 30 to expose the surface of the emitter layer 103, a feeding layer 14 for electroplating comprising a refractory metal, such as WSi, and having a thickness of 300–400 nm is deposited over the entire surface by sputtering, as shown in FIG. 12(f). Then, the feeding layer 14 is masked with a resist except a region where an air-bridge wiring is later produced and including the opening of the resist 7. Thereafter, an Au layer 13 is electroplated on the unmasked region of the feeding layer 14 to a thickness of about 2 µm, followed by removal of the resist from the feeding layer 14. Subsequently, the exposed feeding layer 14, i.e., the feeding layer 14 one which no Au layer is plated, is removed by etching, followed by removal of the resist 7. Thereby, an air-bridge wiring 11 comprising the feeding layer 14 and the plated Au layer 13 is fabricated. This air-bridge wiring 11 is directly connected to the upper surface of the emitter layer 103 and serves as an emitter electrode on the emitter layer 103. As a result of the above-described process steps, an HBT including a united emitter electrode and air-bridge wiring shown in FIG. 13 is obtained.

In the above-described method of fabricating an HBT, the process steps for fabricating the dummy emitter electrode, the emitter layer, and the base electrodes are identical to those according to the first embodiment of the invention. However, a similar air-bridge structure united with an emitter electrode as that shown in FIG. 13 is obtained even when the dummy emitter electrode, the emitter layer, and the base electrodes are fabricated in the process steps according to the second embodiment of the invention.

In this sixth embodiment of the invention, as in the first and second embodiments of the invention, a highly-reliable emitter electrode is fabricated with high stability. Even when the emitter layer 103 and the bottom part 21a of the emitter electrode 21 are reduced in size, the air-bridge wiring 11 united with the emitter electrode is fabricated with high stability in a simple process compared with the process according to the fifth embodiment of the invention. In addition, since the air-bridge wiring 11 is a laminated structure comprising the refractory metal (WSi) feeding layer 14 and the plated low resistance metal (Au) layer 13, the wiring resistance is reduced. Since the air-bridge wiring 11 is employed, the capacitance of the wiring is reduced, whereby the HBT is operated in a higher frequency band. In addition, heat generated in the HBT is dissipated through the emitter electrode 21 and the air-bridge wiring 11 with high efficiency.

Furthermore, in the HBT according to this sixth embodiment, no junction is present between the emitter electrode and the air-bridge wiring, and the emitter electrode and the air-bridge wiring are included in a continuous metal layer. Therefore, the reliability of the connection between the emitter electrode and the air-bridge wiring is improved compared with the HBT according to the fifth embodiment of the invention.

Furthermore, the emitter electrode and the air-bridge wiring are united in one body, and the refractory metal (WSi) feeding layer 14 is employed as a lower layer of the air-bridge wiring 11 that directly contacts the emitter layer 103, whereby unwanted reaction between the emitter electrode and the emitter layer during the operation of the HBT is suppressed, improving the reliability of the HBT.

Further, as in the first to fifth embodiments, since the emitter layer 103 is produced self-alignedly with the bottom part 21a of the emitter electrode 21, the fabricating process is simplified and the uniformity of the electrical characteristics of the HBT is improved.

The material of the feeding layer 14 is not restricted to WSi. For example, TiSi, TiN, Ti/Au, or Ti/Mo/Au may be employed. In the Ti/Au and the Ti/Mo/Au, both the Ti layer and the Mo layer are 30–50 nm thick, and the Au layer is 200–300 nm thick.

Further, a guard ring as described in the second and fourth embodiments of the invention may be formed on the side surface of the emitter layer 103.

What is claimed is:

1. A semiconductor device comprising:
   a laminated semiconductor structure comprising a collector layer, a base layer, and an emitter layer disposed on a semiconductor substrate;
   an emitter electrode disposed on the emitter layer and comprising a planar bottom part that contacts the emitter layer, a peripheral side part extending upward from the bottom part, and an upper fringe part protruding outward from the peripheral side part in a direction perpendicular to the peripheral side part, wherein the planar bottom part, the peripheral side part, the upper fringe part comprise a conductive material united in one body;
   base electrodes contacting the base layer at opposite sides of the emitter electrode and self-aligned with the planar bottom part of the emitter electrode; and collector electrodes contacting the collector layer.

2. The semiconductor device of claim 1 wherein the emitter electrode comprises a refractory metal.

3. The semiconductor device of claim 1 further including an air-bridge wiring connected to the emitter electrode inside the upper fringe part and including the planar bottom part.

4. The semiconductor device of claim 1 further including an air-bridge wiring comprising the same material as the emitter electrode and united with the emitter electrode in one body.

5. The semiconductor device of claim 4 wherein the united emitter electrode and air-bridge wiring comprises a lower layer of a refractory metal and an upper layer of a another metal.

6. The semiconductor device of claim 1 wherein the emitter layer protrudes upward from a region of the base layer and the planar bottom part of the emitter electrode covers the emitter layer.

7. The semiconductor device of claim 6 wherein the emitter layer is self-aligned with the planar bottom part of the emitter electrode.

8. The semiconductor device of claim 6 wherein the emitter layer comprises a lower part disposed on the base layer and an upper part smaller than the lower part and disposed on and within the lower part, and a difference in level is produced at a boundary between the upper part and the lower part on the peripheral side surface of the emitter layer.

* * * * *